(12) United States Patent
Seki

(10) Patent No.: US 7,012,367 B2
(45) Date of Patent: Mar. 14, 2006

(54) DISPLAY DEVICE HAVING LIGHT BLOCKING LAYER, AND ELECTRIC DEVICE

(75) Inventor: Shunichi Seki, Nagano-ken (JP)

(73) Assignee: Seiko Epson Corporation, Tokyo (JP)

(*) Notice: Subject to any disclaimer, the term of this patent is extended or adjusted under 35 U.S.C. 154(b) by 218 days.

(21) Appl. No.: 10/310,923

(22) Filed: Dec. 6, 2002

(65) Prior Publication Data

US 2003/0146695 A1 Aug. 7, 2003

(30) Foreign Application Priority Data

Dec. 18, 2001 (JP) ............................. 2001-385169
Nov. 25, 2002 (JP) ............................. 2002-341376

(51) Int. Cl.
  *H05B 33/10* (2006.01)
(52) U.S. Cl. ............... 313/506; 313/505; 313/512; 257/72
(58) Field of Classification Search ........ 313/503–506, 313/495–498, 509, 512; 257/91, 98, 72
See application file for complete search history.

(56) References Cited

U.S. PATENT DOCUMENTS

| 5,793,457 | A | * | 8/1998 | Tamai et al. ............... 349/110 |
| 6,114,715 | A | * | 9/2000 | Hamada ...................... 257/72 |
| 6,380,672 | B1 | * | 4/2002 | Yudasaka .................... 313/504 |
| 6,420,834 | B1 | * | 7/2002 | Yamazaki et al. ........ 315/169.3 |
| 6,445,005 | B1 | | 9/2002 | Yamazaki et al. |
| 6,466,281 | B1 | * | 10/2002 | Huang et al. ................ 349/44 |
| 6,518,700 | B1 | * | 2/2003 | Friend et al. ............... 313/504 |
| 6,570,631 | B1 | * | 5/2003 | Ko .............................. 349/43 |
| 6,593,691 | B1 | | 7/2003 | Nishi et al. |
| 6,630,274 | B1 | | 10/2003 | Kiguchi et al. |
| 6,683,410 | B1 | * | 1/2004 | Hitoshi ....................... 313/506 |
| 2002/0047514 | A1 | * | 4/2002 | Sakurai et al. ............. 313/503 |
| 2002/0060518 | A1 | * | 5/2002 | Duineveld et al. ......... 313/506 |
| 2003/0107314 | A1 | * | 6/2003 | Urabe et al. ................ 313/506 |
| 2003/0173897 | A1 | * | 9/2003 | Iwase et al. ................ 313/512 |

FOREIGN PATENT DOCUMENTS

| CN | 1205096 A | 1/1999 |
| CN | 1289151 A | 3/2001 |
| CN | 1291289 A | 4/2001 |
| CN | 1300105 A | 6/2001 |
| EP | 1 226 974 | 7/2002 |
| JP | 08-262998 | 10/1996 |
| JP | A 10-92579 | 4/1998 |
| JP | A 11-121168 | 4/1999 |
| JP | A 2001-68267 | 3/2001 |
| JP | A 2001-130141 | 5/2001 |
| KR | 1999-0057105 | 7/1999 |
| KR | 2002-0064302 | 4/2002 |
| WO | WO 98/12689 | 3/1998 |
| WO | WO99/48339 | 9/1999 |

* cited by examiner

*Primary Examiner*—Karabi Guharay
*Assistant Examiner*—Sikha Roy
(74) *Attorney, Agent, or Firm*—Oliff & Berridge, PLC

(57) ABSTRACT

A display apparatus is provided that prevents shortening of the life of the luminescent elements and has a superior contrast ratio. The display apparatus is composed by forming a plurality of luminescent elements on a substrate and providing bank sections between each of the luminescent elements. The bank sections are formed from a first bank layer located on the side of the substrate and a second bank layer formed on the first bank layer. A light blocking layer is then provided between the first bank layer and the second bank layer.

8 Claims, 25 Drawing Sheets

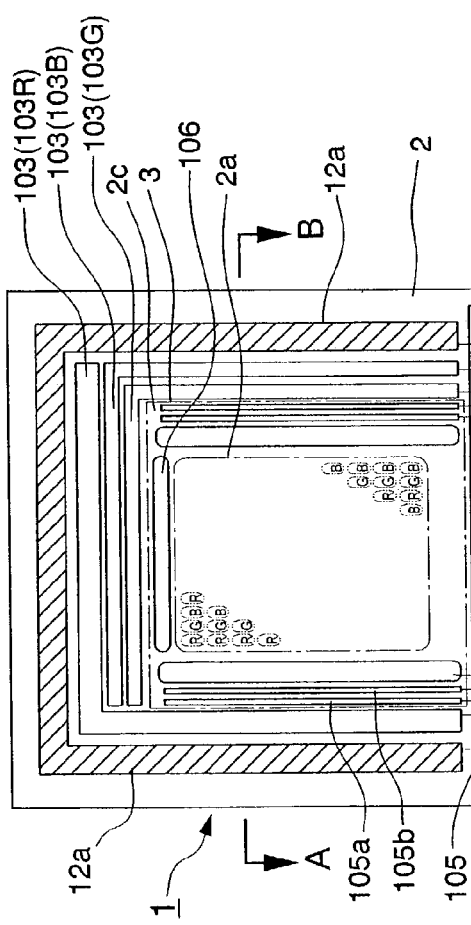
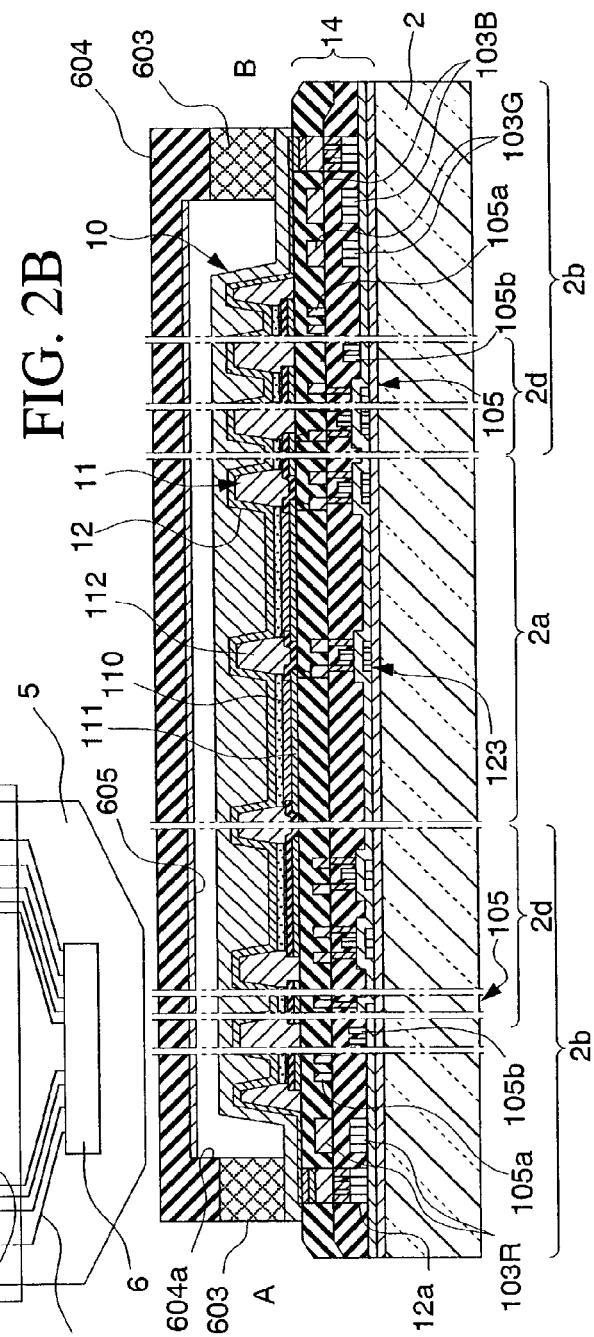
FIG. 2A
FIG. 2B

STRIPED

MOSAIC

DELTA

DISPLAY DEVICE HAVING LIGHT BLOCKING LAYER, AND ELECTRIC DEVICE

BACKGROUND OF THE INVENTION

1. Field of the Invention

The present invention relates to a display apparatus and electric device.

2. Background Art

As a result of the growing use of organic fluorescent materials and other luminescent materials as ink, and the proliferation of ink jet methods that discharge said ink (composition) onto a base material in recent years, color display apparatuses employing a structure in which a luminescent layer composed of said luminescent material is interposed between an anode and cathode, and particularly organic electroluminescence (EL) display apparatuses using an organic luminescent material for the luminescent material, are being developed by employing methods for patterning luminescent materials (refer to Patent Document 1 (Japanese Patent Unexamined Application, First Publication No. 10-12377)).

Therefore, the following provides an explanation of a display apparatus of the prior art (organic EL display apparatus) with reference to the drawings.

FIG. 31 is a cross-sectional schematic drawing showing the essential portion of a display apparatus of the prior art.

The display apparatus shown in FIG. 31 is composed by sequentially laminating element section 811 and cathode 812 on substrate 802. In addition, circuit element section 814 is provided between element section 811 and substrate 802.

In this display apparatus of the prior art, light emitted from luminescent elements 910 provided within element section 811 on the side of substrate 802 is radiated to the lower side (observer side) of substrate 802 through circuit element section 814 and substrate 802, while light emitted to the opposite side of substrate 802 from luminescent elements 910 is reflected by cathode 812 and is radiated to the lower side (observer side) of substrate 802 through circuit element section 814 and substrate 802.

Circuit element section 814 is composed by sequentially laminating transparent substrate film 814a, transparent gate insulating film 942, transparent first interlayer insulating film 944 and transparent second interlayer insulating film 947 on substrate 802, island-shaped silicon films 941 are provided on transparent substrate film 814a, and gate electrodes 943 (scanning lines) are provided on gate insulating film 942. A channel region, along with a drain region and source region that surround this channel region, all of which are not shown in the drawing, are provided in silicon films 941, and gate electrodes 943 are provided at locations corresponding to the channel regions of silicon films 941. In addition, pixel electrodes 911 (anodes) patterned into a roughly rectangular shape when viewed overhead are laminated onto second interlayer insulating film 947. Contact holes 945 and 946 are formed that pass through first and second interlayer insulating films 944 and 947, one of the contact holes 945 connects a source region not shown of a silicon film 941 and pixel electrode 911, while the other contact hole 945 is connected to power supply wire 948. In this manner, driving thin film transistors 913 connected to each pixel electrode 911 are formed in circuit element section 814.

Element section 811 is mainly composed of luminescent elements 910 respectively laminated on a plurality of pixel electrodes 911, and bank sections 912 provided between each pixel electrode 911 and luminescent element 910 that separate each luminescent element 910.

Openings 912c are provided that correspond to the formed locations of pixel electrodes 911 as a result of bank sections 912 being formed so as to ride up onto the peripheral edges of pixel electrodes 911. Bank sections 912 are given ink repellency by being formed from an ink repellent resin such as fluororesin or from a resin in which the surface has been fluorinated by $CF_4$ plasma treatment and so forth, and liquid droplets are patterned in openings 912c due to the ink repellency of bank sections 912 when composite ink (composition) containing an organic EL material is discharged from an ink jet in the form of ink droplets.

Luminescent elements 910 are composed of positive hole injection/transport layer 910a formed on pixel electrode 911 and luminescent layer 910b arranged adjacent to positive hole injection/transport layer 910a.

Positive hole/transport layer 910a is obtained by discharging and drying a composition containing a positive hole injection/transport layer forming material onto pixel electrode 911.

In addition, cathode 812 is formed over the entire surface of element section 811, and serves to inject electrons into luminescent element 910 functioning as a pair with pixel electrode 911. This cathode 812 is formed by a plurality of layers, and typically uses metals having a low work function such as lithium fluoride, calcium, magnesium, silver or barium.

However, in this display apparatus of the prior art, since colored light emitted from luminescent layers expands to not only the observer's side, but also around the periphery of the luminescent layers (regions at which luminescent layers are not formed), colored light emitted from adjacent luminescent layers on both sides of these non-formed regions end up mixing, resulting in the occurrence of color bleeding, while also leading to the risk of a decrease in the contrast ratio of the display apparatus.

In consideration of the above circumstances, the object of the present invention is to provide a display apparatus that prevents shortening of luminescent element lifetime while also having a superior contrast ratio.

SUMMARY OF THE INVENTION

The present invention employs the following constitution in order to achieve the above object.

The display apparatus of the present invention has a plurality of luminescent elements formed within a substrate surface, and a light blocking layer is provided in regions between each of the above luminescent elements when viewed from overhead.

This light blocking layer is formed at a location closer to an observer than the luminescent elements (namely at a location near the surface). For example, in the case of a bottom emission type of display apparatus in which emitted light is radiated towards a substrate, the light blocking layer is provided closer to the substrate side than the location at which the luminescent layers of the luminescent elements are formed. In addition, in the case of a top emission type of display apparatus in which emitted light is radiated towards the opposite side of a substrate, the light blocking layer is arranged closer to the upper layer than the luminescent layers with respect to the substrate surface, such as being provided on the upper portion of partitions (banks) that separate each luminescent element or on the inside of a sealing substrate that covers the substrate surface (surface opposing the substrate surface).

Alternatively, the display apparatus of the present invention has a plurality of luminescent elements formed on a substrate, and bank sections are provided between each of the above luminescent elements; wherein, the bank sections are formed from a first bank layer located on the above substrate side, and a second bank layer formed on the above first bank layer, and a light blocking layer is provided between the above first and second bank layers.

Furthermore, in the present invention, a luminescent element at least includes an electrode formed on a substrate, a functional layer formed adjacent to said electrode, and a counter electrode formed adjacent to said functional layer. In addition, a functional layer at least includes a positive hole injection/transport layer and a luminescent layer.

In addition, the display apparatus of the present invention has a plurality of luminescent elements formed on a substrate, and bank sections are provided between each of the above luminescent elements; wherein, a light blocking layer is provided between the above substrate and the above bank sections.

According to the above display apparatus, as a result of providing a light blocking layer, incoming light from the outside in regions where luminescent elements are not formed as well as outgoing light from the luminescent elements can be blocked, thereby making it possible to improve the legibility of the display apparatus by enhancing its contrast ratio.

In particular, as a result of blocking light from luminescent elements at regions where luminescent elements are not formed, color bleeding caused by mixing of colored light that occurs in display apparatus of the prior art can be prevented, thereby making it possible to enhance the contrast ratio of the display apparatus.

In addition, in the case of providing a light blocking layer between first and second bank layers, the adhesion between the first and second bank layers can be increased.

In addition, in the display apparatus of the present invention, a light blocking opening is preferably provided in the above light blocking layer corresponding to the above luminescent elements.

In addition, in the display apparatus of the present invention, the above light blocking layer is preferably composed of a black resin.

In addition, in the display apparatus of the present invention, the above light blocking layer is preferably formed from a first light blocking film located on the above substrate side, and a second light blocking film located on the side away from the above substrate.

In addition, in the display apparatus of the present invention, the above first light blocking film is preferably a metallic chromium film, and the above second light blocking film is preferably chromium oxide.

According the claimed display apparatus, since a metallic chromium film is arranged on the substrate side, and a chromium oxide film is arranged on the side away from the substrate, together with incoming light from the outside being reflected by the metallic chromium film, outgoing light of luminescent elements in regions where luminescent elements are not formed can be blocked by the chromium oxide film, thereby further improving the legibility of the display apparatus by enhancing its contrast ratio.

In addition, in the display apparatus of the present invention, together with the above first bank layer preferably being comprised of either $SiO_2$ or $TiO_2$, the second bank layer is preferably comprised of either acrylic resin or polyimide resin.

In addition, the display apparatus of the present invention has a plurality of luminescent elements formed on a substrate, and bank sections are provided between each of the above luminescent elements; wherein, the above bank sections are formed by a light blocking layer as a result of being composed from black resin.

In addition, in the display apparatus of the present invention, the above bank sections are preferably formed by the above first bank layer and the above light blocking layer.

According to the claimed display apparatus, since the above bank sections are composed from black resin and also serve as light blocking layers, incoming light from the outside in the region where a luminescent element is not formed by this bank section, and outgoing light from the luminescent element, can be blocked, thereby enhancing the contrast ratio of the display apparatus and improving legibility.

In particular, since light from a luminescent element is blocked in a region where a luminescent element is not formed, color bleeding between colored light that occurred in display apparatuses of the prior art can be prevented, thereby making it possible to enhance the contrast ratio of the display apparatus.

In addition, in the display apparatus of the present invention, together with the above first bank layer being composed of either $SiO_2$ or $TiO_2$, the above resin that composes the above organic bank layer is preferably composed of either acrylic resin or polyimide resin.

In addition, in the display apparatus of the present invention, at least a portion of the above first bank layer is processed to have lyophilicity.

Next, the electric (electronic) device of the present invention is an electric device having a display apparatus and a drive circuit for driving the above display apparatus; wherein the above display apparatus is composed by forming a plurality of luminescent elements on a substrate, and a light blocking layer is provided in the regions between each of the above luminescent elements when viewed overhead.

In addition, the electric device of the present invention is an electric device having a display apparatus and a drive circuit for driving the above display apparatus; wherein, the above display apparatus is composed by forming a plurality of luminescent elements on a substrate, a bank section is provided between each of the above luminescent elements, the above bank section is formed from a first bank layer located on the above substrate side and a second bank layer formed on the above first bank layer, and a light blocking layer is provided between the above first bank layer and the above second bank layer.

In addition, the electric device of the present invention is an electric device having a display apparatus and a drive circuit for driving the above display apparatus; wherein, the above display apparatus is composed by forming a plurality of luminescent elements on a substrate, a bank section is provided between each of the above luminescent elements, and a light blocking layer is provided between the above substrate and the above bank section.

Moreover, the electric device of the present invention is an electric device having a display apparatus and a drive circuit for driving the above display apparatus; wherein, the above display apparatus is composed by forming a plurality of luminescent elements on a substrate, a bank section is provided between each of the above luminescent elements, and a light blocking layer composed from black resin is formed on the above bank section.

According to the claimed electric device, an electric device can be composed that has a display apparatus with a long lifetime and superior contrast ratio.

As has been explained above, according to the display apparatus of the present invention, as a result of providing a light blocking layer, incoming light from the outside in a region where a luminescent element is not formed, and outgoing light from a luminescent element, can be blocked, thereby making it possible to enhance the contrast ratio of the display apparatus and improve legibility.

In particular, since light from a luminescent element is blocked in a region where a luminescent element is not formed, color bleeding between colored light that occurred in display apparatuses of the prior art can be prevented, thereby making it possible to enhance the contrast ratio of the display apparatus.

In addition, in the case of providing a light blocking layer between a first bank layer and a second bank layer, the adhesion between the first bank layer and second bank layer can be enhanced.

BRIEF DESCRIPTION OF THE DRAWINGS

FIGS. 2A and 2B are drawings showing a display apparatus of a first embodiment of the present invention, with FIG. 2A being an overhead schematic drawing of the display apparatus, and FIG. 2B being a cross-sectional schematic drawing taken along line AB of FIG. 2A.

DETAILED DESCRIPTION OF THE PREFERRED EMBODIMENTS

Figure 1:
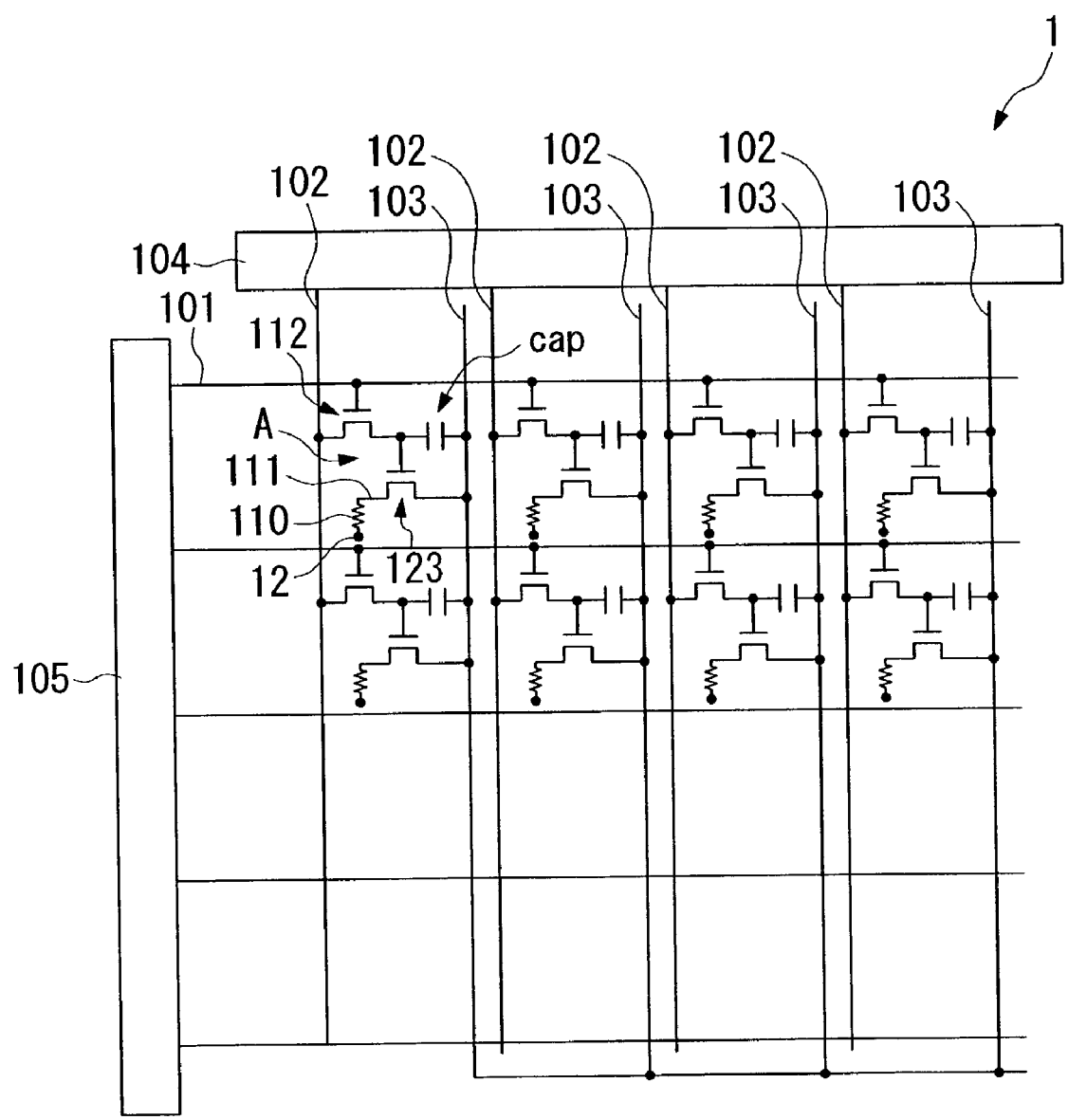
FIG. 1 is an overhead schematic drawing of the wiring structure of a display apparatus of a first embodiment of the present invention.

The following provides an explanation of embodiments of the display apparatus of the present invention with reference to the drawings. Furthermore, in FIGS. 1 through 26, in order to make each layer and each member of a size that allows it to be recognized in the drawings, each layer and member is represented with a scale that differs from actual layers and members.

[First Embodiment]

The following provides an explanation of a first embodiment of the present invention with reference to the drawings.

FIG. 1 shows an overhead schematic drawing of the wiring structure of a display apparatus of the present embodiment of the invention, while FIG. 2 shows an overhead schematic drawing and cross-sectional schematic drawing of a display apparatus of the present embodiment of the invention.

As shown in FIG. 1, a display apparatus 1 of the present embodiment of the invention is provided with pixel regions A having a constitution in which a plurality of scanning lines 101, a plurality of signal lines 102 extending in a direction that intersects scanning lines 101, and a plurality of power lines 103 extending in a direction in parallel with signal lines 102, are respectively wired, and which are located near each intersection of scanning lines 101 and signal lines 102.

Data side drive circuit 104 provided with a shift register, level shifter, video line and analog switch is connected to signal lines 102. In addition, scanning side drive circuit 105 provided with a shift register and level shifter is connected to scanning lines 101.

Moreover, a switching thin film transistor 112, in which scanning signals are supplied to a gate electrode via scanning lines 101, a holding capacitor cap that holds pixel signals supplied from signal lines 102 via this switching thin film transistor 112, a driving thin film transistor 123 in which pixel signals held by said holding capacitor cap are supplied to a gate electrode, a pixel electrode 111 (electrode) to which drive current flows from said power lines 103 when electrically connected to power lines 103 via this driving thin film transistor 123, and functional layer 110 interposed between this pixel electrode 111 and a cathode 12 (counter electrode), are provided in each pixel region A. A luminescent element is composed by electrode 111, counter electrode 12 and functional layer 110.

According to this constitution, when scanning lines 110 are driven and switching thin film transistor 112 is switched on, the potential of signal lines 102 at that time is held by holding capacitor cap, and the on/off status of driving thin film transistor 123 is determined according to the status of said holding capacitor cap. Current flows from power lines 103 to pixel electrode 111 via a channel of driving thin film transistor 123, and current further flows to cathode 12 via functional layer 110. Functional layer 110 then emits light corresponding to the amount of current that flows through it.

Next, as shown in FIGS. 2A and 2B, display apparatus 1 of the present embodiment is provided with a transparent substrate 2 made of glass and so forth, luminescent element section 11 equipped with luminescent elements arranged in the form of a matrix and formed on substrate 2, and cathode 12 formed on lumine scent element section 11. Display element 10 is composed by luminescent element section 11 and cathode 12.

Substrate 2 is a transparent substrate made of, for example, glass, and is divided into display region 2a located in the center of substrate 2, and a non-display region 2b located around the periphery of substrate 2 surrounding display region 2a.

Display region 2a is a region formed by luminescent elements arranged in the form of a matrix, and non-display region 2b is formed around the out side of this display region. Dummy display region 2d adjacent to display region 2a is formed in non-display region 2b.

In addition, as shown in FIG. 2B, circuit element section 14 is provided between luminescent element section 11 and substrate 2, and this circuit element section 14 is provided with the previously mentioned scanning lines, signal lines, holding capacitor, switching thin film transistor and driving thin film transistor 123 and so forth.

In addition, one end of cathode 12 is connected from luminescent element section 11 to cathode wiring 12a formed on substrate 2, and one end of this wiring is connected to wiring 5a on a flexible substrate 5. In addition, wiring 5a is connected to a drive IC 6 (drive circuit) provided on flexible substrate 5.

In addition, as shown in FIGS. 2A and 2B, the above-mentioned power lines 103 (103R, 103G, 103B) are wired to a non-display region 2b of circuit element section 14.

In addition, the above-mentioned scanning side drive circuits 105 are arranged on both sides of display region 2a in FIG. 2A. These scanning side drive circuits 105 are provided within circuit element section 14 on the lower side of dummy region 2d. Moreover, drive circuit control signal wiring 105a and drive circuit power supply wiring 105b connected to scanning side drive circuits 105 are provided within circuit element section 14.

Moreover, inspection circuit 106 is arranged on the upper side of display region 2a in FIG. 2A. This inspection circuit 106 makes it possible to inspect the quality of the display apparatus for defects during the course of manufacturing and at the time of shipment.

In addition, as shown in FIG. 2B, sealing section 3 is provided on luminescent element section 11. This sealing section 3 is composed of sealing resin 603 coated onto substrate 2 and sealing can 604. Sealing resin 603 is made of a thermosetting resin or ultraviolet setting resin, and an epoxy resin that is a type of thermosetting resin is particularly preferable.

This sealing resin 603 is coated in the shape of a ring around substrate 2, and is coated by, for example, a microdispenser. This sealing resin 603 joins substrate 2 and sealing can 604, and prevents oxidation of a luminescent layer not shown in the drawing that is formed in cathode 12 or luminescent element section 11 by preventing the infiltration of water or oxygen into sealing can 604 from between substrate 2 and sealing can 604.

Sealing can 604 is made of glass or metal, is joined to substrate 2 via sealing resin 603, and indentation 604 that houses a display element 10 is provided inside. In addition, a getter that absorbs water, oxygen and so forth is affixed to indentation 604 so as to be able to absorb water or oxygen that has infiltrated inside sealing can 604. Furthermore, this getter 605 may also be omitted.

Figure 3:
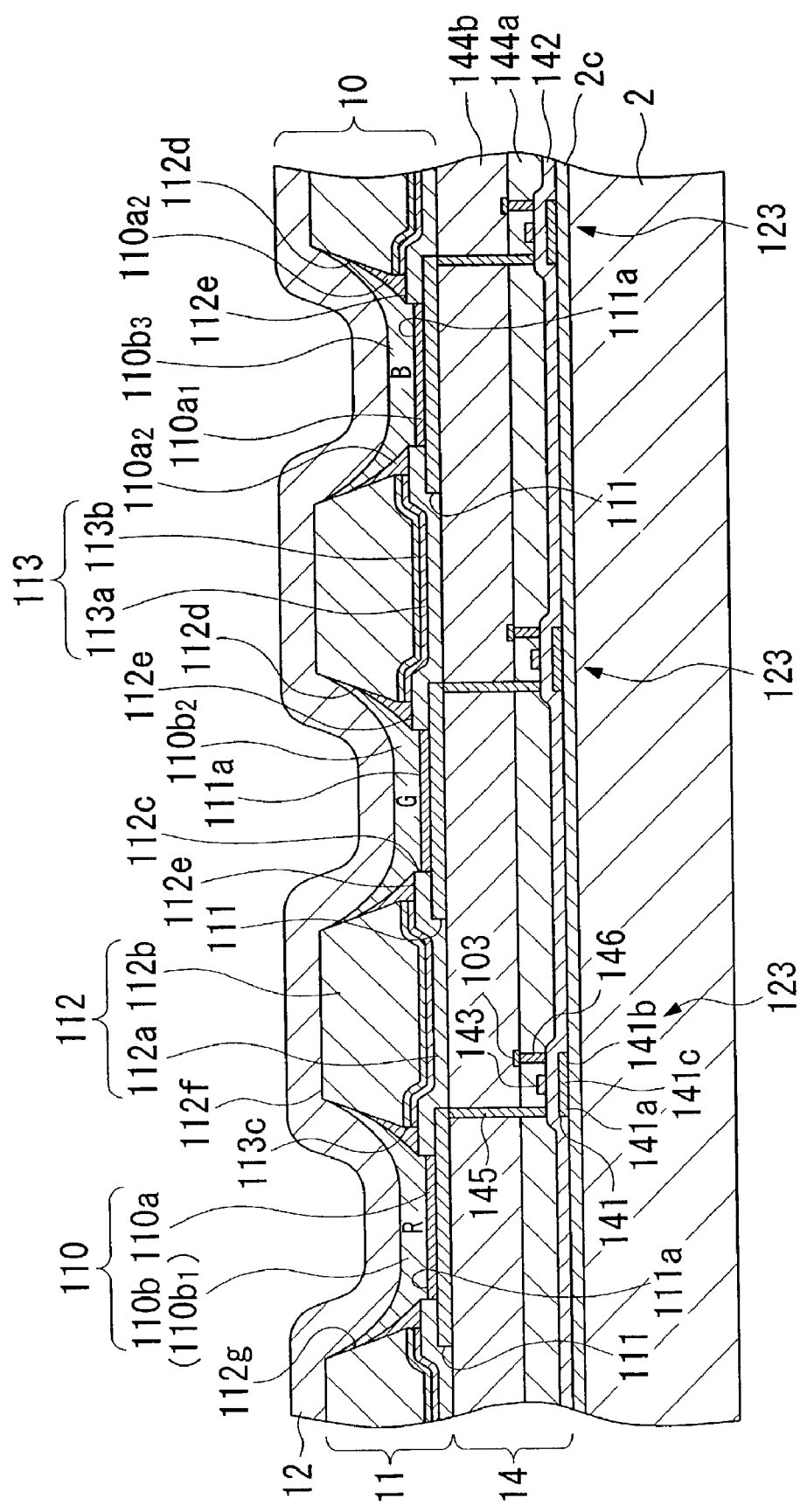
FIG. 3 is a drawing showing the essential portion of a display apparatus of a first embodiment of the present invention.

Next, an enlarged view of the cross-sectional structure of a display region in a display apparatus is shown in FIG. 3. Three pixel regions A are shown in this FIG. 3.

This display apparatus is composed by sequentially laminating circuit element section 14, in which TFT and other circuits are formed, luminescent element section 11, on which a functional layer 110 is formed, and cathode 12 on substrate 2.

In this display apparatus 1, together with light emitted from a functional layer 10 towards the side of substrate 2 being radiated to the lower side (observer side) of substrate 2 by passing through circuit element section 14 and substrate 2, light emitted from a functional layer 10 towards the opposite side of substrate 2 is reflected and then radiated towards the lower side (observer side) of substrate 2 by passing through circuit element section 14 and substrate 2.

Furthermore, light emitted from the cathode side can be made to be radiated by using a transparent material for cathode 12. Examples of transparent materials that can be used include ITO, Pt, Ir, Ni and Pd. A film thickness of about 75 nm is preferable for the film thickness, and film thickness less than this film thickness is more preferable.

An undercoating protective layer 2c composed of a silicon oxide film is formed on substrate 2 in circuit element section 14, and an island-shaped semiconductor film 141 composed of polycrystalline silicon is formed on this undercoating protective layer 2c. Furthermore, a source region 141a and a drain region 141b are formed by highly concentrated P ion implantation in semiconductor film 141. Furthermore, the region at which P is not introduced becomes channel region 141c.

Moreover, transparent gate insulating film 142 that covers undercoating protective film 2c and semiconductor film 141 is formed on circuit element section 14, a gate electrode 143 (scanning line 101) composed of Al, Mo, Ta, Ti or W and so forth is formed on gate insulating film 142, and a transparent first interlayer insulating film 144a and a second interlayer insulating film 144b are formed on gate electrode 143 and gate insulating film 142. Gate electrode 143 is provided at a location corresponding to channel region 141c of semiconductor film 141. In addition, contact holes 145 and 146 connected to source and drain regions 141a and 141b, respectively, of semiconductor film 141 are formed passing through first and second interlayer insulating films 144a and 144b.

A transparent pixel electrode 111 composed of ITO and so forth is patterned to a prescribed shape and formed on second interlayer insulating film 144b, and one contact hole 145 is connected to this pixel electrode 111.

In addition, the other contact hole 146 is connected to power line 103.

In this manner, driving thin film transistor 123 connected to each pixel electrode 111 is formed in circuit element section 14.

Furthermore, although the previously mentioned holding capacitor cap and switching thin film transistor 142 are also formed in circuit element section 14, these are not shown in FIG. 3.

Next, as shown in FIG. 3, luminescent element section 11 is mainly composed of a functional layer 110 laminated on each of a plurality of pixel electrodes 111, bank section 112 provided between each pixel electrode 111 and functional layer 110 which separates each functional layer 110, and light blocking layer 113. Cathode 12 is arranged on functional layer 110. A luminescent element is composed by these pixel electrodes 111, functional layer 110 and cathode 12. Here, pixel electrode 111 is formed by, for example, ITO, and is formed by patterning into a roughly rectangular shape when viewed overhead. The thickness of this pixel electrode 111 is preferably within the range of, for example, 50–200 nm, and particularly preferably about 150 nm. Bank section 112 is provided between each pixel electrode 111.

As shown in FIG. 3, bank section 112 is composed by laminating inorganic bank layer 112a located on the side of substrate 2 (first bank layer), and organic bank layer 112b located away from substrate 2 (second bank layer). In addition, light blocking layer 113 is arranged between inorganic bank layer 112a and organic bank layer 112b.

Inorganic and organic bank layers 112a and 112b are formed so as to ride up onto the peripheral edge of pixel electrode 111. In terms of the horizontal plane, the structure is such that the peripheral edge of pixel electrode 111 and inorganic bank layer 112a are arranged so as to be overlapping in the horizontal plane. In addition, organic bank layer 112b is similarly arranged so as to overlap a portion of pixel electrode 111 in the horizontal plane. In addition, inorganic bank layer 112a is formed further towards the center of pixel electrode 111 than organic bank layer 112b. As a result of each first laminated section 112e of inorganic bank layer 112a being formed on the inside of pixel electrode 111 in this manner, lower opening 112c is provided corresponding to the formed location of pixel electrode 111.

In addition, upper opening 112d is formed in organic bank layer 112b. This upper opening 112d is provided at the formed location of pixel electrode 111 and so as to correspond to lower opening 112c. As shown in FIG. 3, upper opening 112d is formed to be wider than lower opening 112c and narrower than pixel electrode 111. In addition, it may also be formed so that the location of the upper portion of upper opening 112d is nearly at the same location as the edge of pixel electrode 111. In this case, as shown in FIG. 3, the cross-section of upper opening 112d of organic bank layer 112b has an inclined shape.

Opening 112g that passes through inorganic bank layer 112a and organic bank layer 112b is then formed by connecting lower opening 112c and upper opening 112d in bank section 112.

In addition, inorganic bank layer 112a is preferably composed of an inorganic material such as $SiO_2$ or $TiO_2$. The film thickness of this inorganic bank layer 112a is preferably within the range of 50–200 nm, and is particularly preferably 150 nm. If the film thickness is less than 50 nm, inorganic bank layer 112a becomes thinner than a positive hole injection/transport layer to be described later, which is not preferable since it prevents the securing of flatness for the positive hole injection/transport layer. In addition, if the film thickness exceeds 200 nm, the level difference with lower opening 112c becomes large, which is not preferable since it prevents the securing of flatness of a luminescent layer to be described later that is laminated onto the positive hole injection/transport layer.

Moreover, organic bank layer 112b is formed from an ordinary resist such as acrylic resin or polyimide resin. The thickness of this organic bank layer 112b is preferably within the range of 0.1–3.5 $\mu$m, and particularly preferably about 2 $\mu$m. If the thickness is less than 0.1 $\mu$m, organic bank layer 112b becomes thinner than the total thickness of the positive hole injection/transport layer and the luminescent layer to be described later, which is not preferable since it results in the risk of the luminescent layer overflowing from upper opening 112d. In addition, if the thickness exceeds 3.5 $\mu$m, the level difference caused by upper opening 112d becomes excessively large, which is not preferable since step coverage of cathode 12 formed on organic bank layer 112b can no longer be ensured. In addition, if the thickness of organic bank layer 112b is made to be 2 $\mu$m or more, insulation with driving thin film transistor 123 can be improved, thereby making this desirable.

In addition, regions exhibiting lyophilic properties and regions exhibiting liquid repellence are formed on bank section 112.

The regions that exhibit lyophilic properties are first laminated section 112e of inorganic bank layer 112a and electrode surface 111a of pixel electrode 111, and these regions are surface-treated to be lyophilic by plasma treatment using oxygen for the treatment gas. In addition, the regions that exhibit liquid repellence are the wall surface of upper opening 112d and the upper surface 112f of organic bank layer 112b, and the surfaces of these regions are fluorine-treated (treated to be liquid repellent) by plasma treatment using methane tetrafluoride, tetrafluoromethane or carbon tetrafluoride for the treatment gas.

Next, as shown in FIG. 3, functional layer 110 is composed of positive hole injection/transplant layer 110a laminated on pixel electrode 111, and luminescent layer 110b formed on positive hole injection/transplant layer 110a adjacent to it. Furthermore, other functional layers having other functions may also be formed adjacent to lumine scent layer 110b. For example, an electron transport layer can also be formed.

Together with having the function of injecting positive holes into luminescent layer 10b, positive hole injection/transport layer 110a also has the function of transporting positive holes within positive hole injection/transport layer 110a. By providing such a positive hole injection/transport layer 110a between pixel electrode 111 and luminescent layer 110b, the luminescent efficiency, lifetime and other element characteristics of luminescent layer 110b are improved. In addition, in luminescent layer 110b, positive holes injected from positive hole injection/transport layer 110a and electrons injected from cathode 12 are recoupled in the luminescent layer to emit light.

Positive hole injection/transport layer 110a is composed of flat section 110a1 located within lower opening 112c and formed on pixel electrode surface 111a, and peripheral edge section 110a2 located within upper opening 112d and formed on first laminated section 112e of the inorganic bank layer. In addition, depending on its structure, positive hole injection/transport layer 110a may be formed only on pixel electrode 111 and between it and inorganic bank layer 112a (lower opening 110c) (there is also a mode in which it is only formed in the previously mentioned flat section).

This flat section 110a1 is formed to have a constant thickness within the range of, for example, 50–70 nm.

In the case peripheral edge section 110a2 is formed, together with being located on first laminated section 112e, it is in contact with the wall surface of upper opening 112d, namely organic bank layer 112b. In addition, the thickness of peripheral edge section 110a2 is thinner on the side close to electrode surface 111a, gradually increases along the direction moving away from electrode surface 111a, and is the thickest near the wall surface of lower opening 112d.

The reason for peripheral edge section 110a2 exhibiting the above shape is that, since positive hole injection/transport layer 110a is formed by discharging a first composition containing a positive hole injection/transport layer forming material and polar solvent into opening 112 and then removing the polar solvent, volatilization of the polar solvent occurs mainly on first laminated section 112e of organic bank layer 112a, and a positive hole injection/transport layer forming material is intensively concentrated and precipitated on this first laminated section 112e.

In addition, luminescent layer 110b is formed across flat section 110a1 and peripheral edge section 110a2 of positive hole injection/transport layer 110a, and its thickness on flat section 110a1 is made to be within the range of 50–80 nm.

Luminescent layer 110b has three types of luminescent layers consisting of red luminescent layer 110b1 that emits red light (R), green luminescent layer 110b2 that emits green light (G), and blue luminescent layer 110b3 that emits blue light (B), and each luminescent layer 110b1 through 110b3 is arranged in the form of stripes.

As has been described above, since peripheral edge section 110a2 of the positive hole injection/transport layer 110a is tightly adhered to the wall surface of upper opening 112d (organic bank layer 112b), luminescent layer 110b does not make direct contact with organic bank layer 112b. Thus, the migration of water contained as an impurity in organic bank layer 112b to the side of luminescent layer 110b can be inhibited by peripheral edge section 110a2, thereby preventing oxidation of luminescent layer 110b by water.

In addition, since peripheral edge section 110a2 is formed at a uniform thickness on first laminated section 112e of inorganic bank layer 112a, peripheral edge section 110a2 is insulated from pixel electrode 111 by first laminated section 112e, and there is no injection of positive holes from peripheral edge section 110a2 to luminescent layer 110b. As a result, current from pixel electrode 111 only flows through flat section 112a1, and positive holes can be uniformly transported from flat section 112a1 to luminescent layer 110b, which together with allowing only the central section of luminescent layer 110b to emit light, enables the amount of emitted light in luminescent layer 110b to be made constant.

In addition, since inorganic bank layer 112a is extended farther towards the center of pixel electrode 111 than organic bank layer 112b, the shape of the junction between pixel electrode 111 and flat section 110a1 can be trimmed by this inorganic bank layer 112a, and variations in luminescent intensity between each luminescent layer 110b can be suppressed.

Moreover, since electrode surface 111a of pixel electrode 111 and first laminated section 112e of inorganic bank layer 112a are lyophilic, functional layer 110 uniformly adheres to pixel electrode 111 and inorganic bank layer 112a, and shorts between pixel electrode 111 and cathode 12 can be prevented without making functional layer 110 extremely thin on inorganic bank layer 112a.

In addition, since upper surface 112f of organic bank layer 112b and the wall surface of upper opening 112d exhibit liquid repellency, there are no decreases in the adhesion between functional layer 110 and organic bank layer 112b, and functional layer 110 is not formed overflowing from opening 112g.

Furthermore, mixtures of polythiophene derivatives such as polyethylene dioxythiophene and polystyrene sulfonic acid, etc. can be used as a positive hole injection/transport layer forming material.

In addition, examples of materials that can be used for luminescent layer 110b include (poly) paraphenylene vinylene derivatives, polyphenylene derivatives, polyfluorene derivatives, polyvinylcarbazole, polythiophene derivatives, perylene pigment, coumarin pigment and rhodamine pigment indicated with compounds 1 through 5 represented with the following structural formulas, or their polymer materials doped with rubrene, perylene, 9,10-diphenylanthracene, tetraphenylbutadiene, Nile red, coumarin 6, quinacrylidone and so forth.

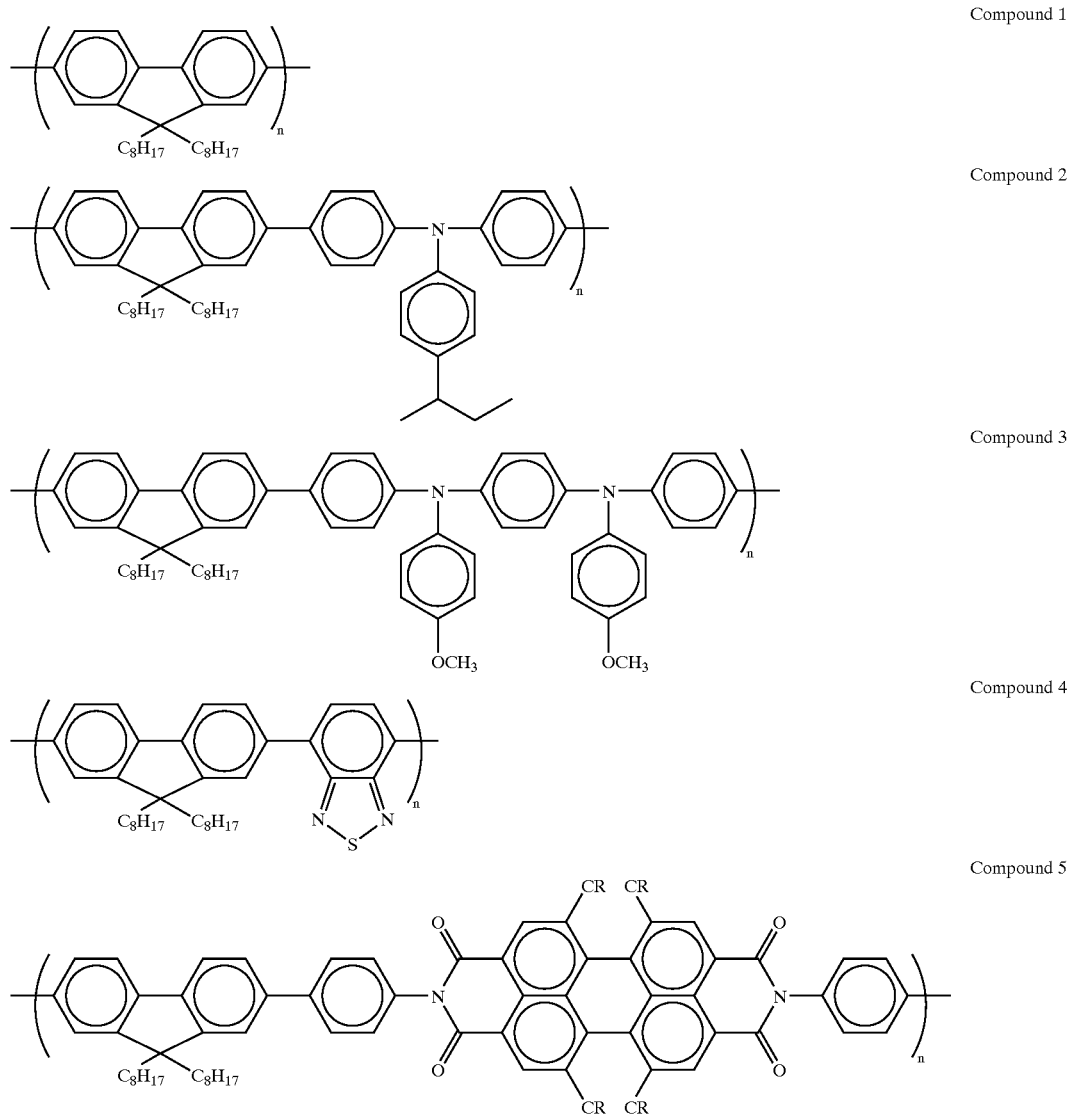

Next, as shown in FIG. 3, light blocking layer 113 is formed between inorganic bank layer 112a and organic bank layer 112b. Light blocking opening 113c is provided at the location corresponding to functional layer 110. As a result, light blocking layer 113 is arranged between corresponding functional layers 110, and is located at a non-formed region of functional layer 110.

Light blocking layer 113 blocks light emitted from luminescent layer 110 and reflected by cathode 12, and improves legibility of the display apparatus by preventing emission of reflected light from regions other than pixel region A. In addition, this light blocking layer 113 inhibits reflection of outside light by cathode 12 to improve the legibility of the display apparatus.

This light blocking layer 113 is formed from a first light blocking film 113a formed on inorganic bank layer 112a and a second light blocking film 113b laminated onto first light blocking film 113a. First light blocking film 113a is composed of, for example, a metallic Cr film having a thickness of 100 nm, while second light blocking film 113b is composed of, for example, a chromium oxide ($Cr_2O_5$) film having a thickness of 50 nm.

As a result of providing this light blocking layer 113, incoming light from outside the non-display region of functional layer 110 as well as outgoing light from functional layer 110 can be blocked at that same non-display area, thereby making it possible to improve legibility by enhancing the contrast ratio of the display apparatus.

In particular, since light from functional layer 110 is blocked at a non-display region of functional layer 110, mixed colored light caused by corresponding colored light that occurred in display apparatuses of the prior art can be blocked, thereby making it possible to enhance the contrast ratio of the display apparatus.

In addition, by providing light blocking layer 113 between inorganic bank layer 112a and organic bank layer 112b, the adhesion of inorganic bank layer 112a and organic bank layer 112b can be enhanced.

Moreover, since a metallic chromium film (113a) is arranged on the substrate side, and a chromium oxide film (113b) is arranged on the side away from the substrate, together with incoming light from the outside being reflected by the metallic chromium film (113a), outgoing light of functional layer 110 in a region where functional layer 110 is not formed can be blocked by the chromium oxide film (113b), thereby making it possible to further improve legibility by enhancing the contrast ratio of the display apparatus.

Furthermore, although a light blocking layer is shown in FIG. 3 employing a two-layer structure, the present invention is not limited to this, but rather a black resin composed by mixing carbon black or other black pigment into a resin may also be used for the light blocking layer, and a light blocking layer may be used that employs a single layer structure consisting of this black resin layer.

Next, cathode 12 is formed over the entire surface of luminescent element section 11, and forms a pair with pixel electrode 111 to fulfill the role of providing current to functional layer 110. This cathode 12 is composed, for example, by laminating a calcium layer and an aluminum layer. At this time, it is preferable to provide a cathode having a low work function on the side close to the luminescent layer, and in this embodiment in particular, cathode 12 fulfills the role of injecting electrons into luminescent layer 110b by being in direct contact with luminescent layer 110b. In addition, since lithium fluoride causes light to be emitted efficiently depending on the material of the luminescent layer, there are also cases in which LiF is formed between luminescent layer 110 and cathode 12. Furthermore, red and green luminescent layers 110b1 and 110b2 are not limited to the use of lithium fluoride, but rather other materials may also be used. Thus, in this case, a layer composed of lithium fluoride may be formed only for blue (B) luminescent layer 110b3, while a material other than lithium fluoride may be laminated onto the other red and green luminescent layers 110b1 and 110b2. In addition, only calcium may be formed on red and green luminescent layers 110b1 and 110b2 without forming lithium fluoride.

Furthermore, the thickness of the lithium fluoride is preferably within the range of, for example, 2–5 nm, and particularly preferably about 2 nm. In addition, the thickness of the calcium is preferably within the range of, for example, 2–50 nm, and particularly preferably about 20 nm.

In addition, since the aluminum that forms cathode 12 reflects light emitted from luminescent layer 110b towards substrate 2, besides an Al film, it is preferably composed of Ag film or a laminated film of Al and Ag, etc. In addition, its thickness is preferably within the range of, for example, 100–1000 nm, and particularly preferably about 200 nm.

Moreover, a protective film for preventing oxidation composed of SiO, $SiO_2$ or SiN and so forth may also be provided on the aluminum.

Furthermore, a sealing can 604 is arranged on a luminescent element formed in this manner. As shown in FIG. 2B, display apparatus 1 is formed by adhering sealing can 604 with sealing resin 603.

The following provides an explanation of a manufacturing method of a display apparatus of the present embodiment with reference to the drawings.

A manufacturing method of display apparatus 1 of the present embodiment is comprised of, for example, (1) a bank section formation step, (2) a plasma treatment step, (3) a positive hole injection/transfer layer formation step, (4) a luminescent layer formation step, (5) a counter electrode formation step, and (6) a sealing step. Furthermore, the manufacturing method is not limited to this, but rather other steps may be deleted or added as necessary.

(1) Bank Section Formation Step

The bank section formation step consists of a step in which bank section 112 is formed at a prescribed location of substrate 2. Bank section 112 is composed by an inorganic bank layer 112a being formed as a first bank layer, and an organic bank layer 112b being formed as a second bank layer. The following provides an explanation of their formation methods.

(1)-1 Formation of Inorganic Bank Layer

Figure 4:
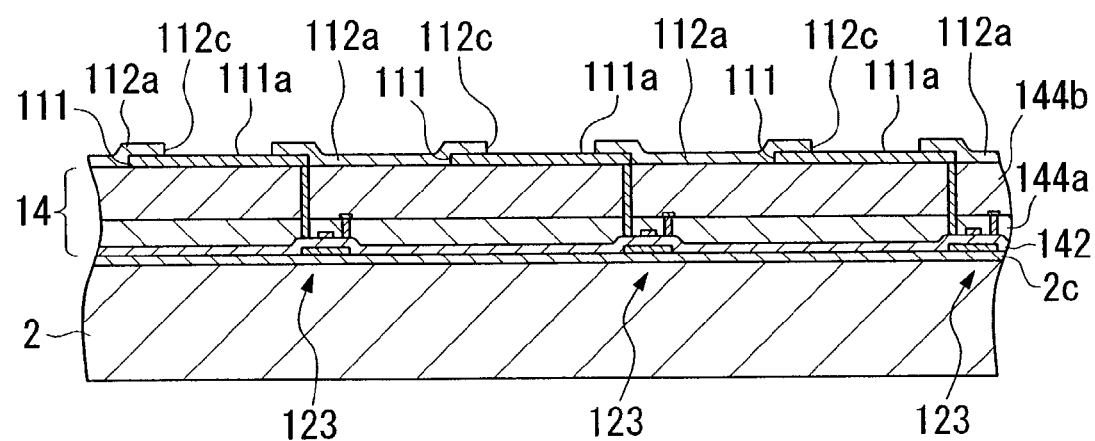
FIG. 4 is a process drawing that explains a manufacturing method of a display apparatus of a first embodiment of the present invention.

To begin with, as shown in FIG. 4, inorganic bank layer 112a is formed at prescribed location on the substrate. The location where inorganic bank layer 112a is formed is on second interlayer insulating film 144b and electrode (here, a pixel electrode) 111. Furthermore, second interlayer insulating film 144b is formed on a circuit element section 14 in which is arranged thin film transistors, scanning lines, signal lines and so forth.

Inorganic bank layer 112a can use as its material an inorganic film such as $SiO_2$ or $TiO_2$. These materials are formed by, for example, CVD, coating, sputtering or vapor deposition.

Moreover, the film thickness of inorganic bank layer 112a is preferably within the range of 50–200 nm, and particularly preferably 150 nm.

Inorganic bank layer 112a forms an inorganic film over the entire surface of interlayer insulating layer 144 and pixel electrode 111, and by subsequently patterning the inorganic film by photolithography and so forth, inorganic bank layer 112a is formed having an opening. This opening corresponds to the formed location of electrode surface 111a of pixel electrode 111, and as shown in FIG. 4, is provided as lower opening 112c.

At this time, inorganic bank layer 112a is formed to as to overlap the peripheral edges of pixel electrode 111. As shown in FIG. 4, by forming inorganic bank layer 112a so that the peripheral edges of pixel electrode 111 overlap with inorganic bank layer 112a, the luminescent region of luminescent layer 110 can be controlled.

(1)-2 Formation of Light Blocking Layer 113 and Organic Bank Layer 112b

Next, light blocking layer 113 and organic bank layer 112b, as the second bank layer, are formed.

Figure 5:
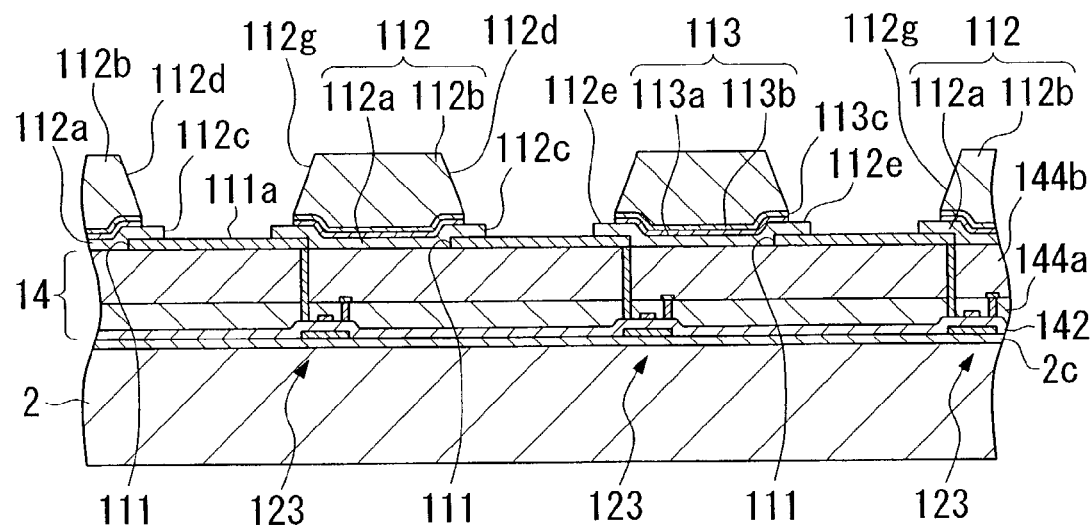
FIG. 5 is a process drawing that explains a manufacturing method of a display apparatus of a first embodiment of the present invention.

As shown in FIG. 5, light blocking layer 113 and organic bank layer 112b is formed on inorganic bank layer 112a.

To begin with, first light blocking film 113a and second light blocking film 113b (light blocking layer 113) are laminated over the entire surface of inorganic bank layer 112a and electrode surface 111a.

First light blocking film 113a is formed by depositing a metallic Cr film by sputtering or vapor deposition and so forth, while second light blocking film 113b is formed by depositing a chromium oxide ($Cr_2O_5$) film by vapor deposition and so forth.

Next, a material such as acrylic resin or polyimide resin having heat resistance and solvent resistance is used for organic bank layer 112b, and organic bank layer 112b is formed using these materials by patterning by photolithography technology and so forth. Furthermore, during patterning, together with forming upper opening 112d in organic bank layer 112b, light blocking opening 113c is formed in light blocking layer 113. Upper opening 112d is provided at the location corresponding to electrode surface 111a and lower opening 112c.

As shown in FIG. 5, upper opening 112d and light blocking opening 113c are preferably formed wider than lower opening 112c formed in inorganic bank layer 112a. Moreover, organic bank layer 112b preferably has a tapered shape, and is preferably formed so that it is narrower than the width of pixel electrode 111 at the lowermost surface of organic bank layer 112, and so that it has about the same width as the width of pixel electrode 111 at the uppermost surface of organic bank layer 112b. As a result, first laminated section 112e that surrounds lower opening 112c of inorganic bank layer 112a has a form that extends farther towards the center of pixel electrode 111 than organic bank layer 112b.

In this manner, opening 112g that passes through inorganic bank layer 112a and organic bank layer 112b is formed by making upper opening 112d, light blocking opening 113 and lower opening 112c continuous.

The film thickness of first light blocking film 113a is preferably for example, 100 nm. In addition, the film thickness of second light blocking film 113b is preferably, for example, 50 nm.

In addition, the thickness of organic bank layer 112b is preferably within the range of 0.1–3.5 μm, and particularly preferably about 2 μm. The reasons for defining the thickness to be within the range are described below.

Namely, if the thickness is less than 0.1 μm, the thickness of organic bank layer 112b becomes thinner than the total thickness of the positive hole injection/transport layer and luminescent layer to be described later, which is not desirable since this results in the risk of luminescent layer 110b overflowing from upper opening 112d. In addition, if the thickness exceeds 3.5 μm, the level difference with upper opening 112d becomes excessively large, which is not desirable since it prevents step coverage of cathode 12 in upper opening 112d from being secured. In addition, if the thickness of organic bank layer 112b is 2 μm or more, insulation between cathode 12 and drive thin film transistor 123 can be enhanced, thereby making this preferable.

(2) Plasma Treatment Step

Next, the plasma treatment step is carried out for the purpose of activating the surface of pixel electrode 111, and treating the surface of bank section 112. In particular, the activation step is carried out mainly for the purpose of washing pixel electrode 111 (ITO) and adjusting the work function. Moreover, lyophilic treatment of the surface of pixel electrode 111 and liquid repellency treatment of the surface of bank section 112 are carried out.

This plasma treatment step can be broadly divided into, for example, preheating step (2)-1, activation treatment step (lyophilic step for imparting lyophilic properties) (2)-2, liquid repellency treatment step (2)-3, and cooling step (2)-4. Furthermore, the plasma treatment step is not limited to these steps, but rather steps may be deleted or added as necessary.

Figure 6:
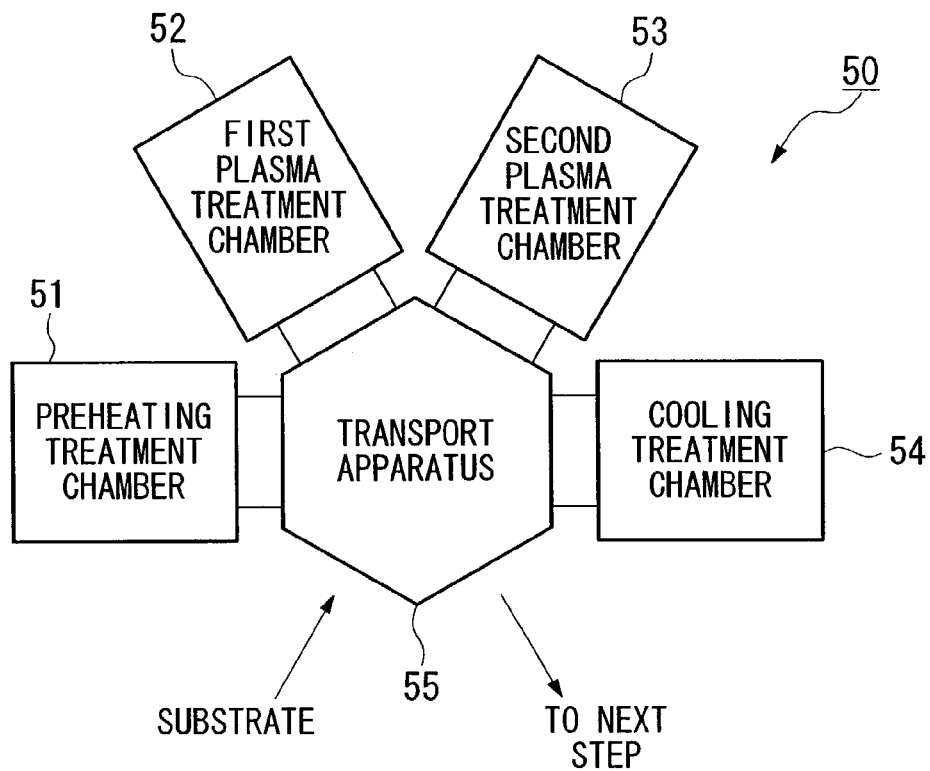
FIG. 6 is an overhead schematic drawing showing an example of a plasma treatment apparatus used for manufacturing a display apparatus of a first embodiment of the present invention.

To begin with, FIG. 6 shows a plasma treatment apparatus used in the plasma treatment step.

Plasma treatment apparatus 50 shown in FIG. 6 is composed of preheating treatment chamber 51, first plasma treatment chamber 52, second plasma treatment chamber 53, cooling treatment chamber 54, and transport apparatus 55 that transports substrate 2 to each of these treatment chambers 51–54. Each treatment chamber 51–54 is arranged in a radial form centering around transport apparatus 55.

To begin with, an explanation is provided of an overview of this step using these apparatuses.

The preheating treatment step is carried out in preheating treatment chamber 51 shown in FIG. 6. Substrate 2 transported from the bank section formation step is heated to a prescribed temperature by this treatment chamber 51.

Following the preheating step, the lyophilic step and liquid repellency treatment step are carried out. Namely, substrate 2 is sequentially transported to first and second plasma treatment chambers 52 and 53, and plasma treatment is performed in treatment chambers 52 and 53, respectively, to impart lyophilic properties. Liquid repellency treatment is carried out after this lyophilic treatment. Following liquid repellency treatment, the substrate is transported to the cooling treatment chamber, and the substrate is cooled to room temperature in cooling treatment chamber 54. After this cooling step, the substrate is transported to the next step in the form of the positive hole injection/transport layer formation step by the transport apparatus.

The following provides a detailed explanation of each step.

(2)-1 Preheating Step

The preheating step is performed by preheating treatment chamber 51. Substrate 2, including bank section 112, is heated to a prescribed temperature in this treatment chamber 51.

A means by which, for example, a heater is attached to a stage on which substrate 2 is placed within treatment chamber 51, and this stage with substrate 2 on it is heated with this heater is adopted for the method for heating substrate 2. Furthermore, other methods may also be employed.

In preheating treatment chamber 51, substrate 2 is heated to within the range of, for example, 70–80° C. This temperature is the treatment temperature in the next step of plasma treatment, and is performed for the purpose of pre-heating substrate 2 in accordance with the next step and to eliminate any variations in the temperature of substrate 2.

If a preheating step is not added, substrate 2 would be heated to the above temperature from room temperature, meaning that treatment would be carried out while temperature fluctuates continuously during the plasma treatment step from the start to the end of the step. Thus, the performing of plasma treatment while the substrate temperature changes has the possibility of leading to non-uniform properties. Thus, preheating is carried out in order to maintain constant treatment conditions and obtain uniform properties.

Therefore, in the plasma treatment step, in the case of performing the lyophilic step or liquid repellency step with substrate 2 placed on a sample stage within first and second plasma treatment chambers 52 and 53, the preheating temperature preferably closely coincides with the temperature of sample stage 56 at which the lyophilic step or liquid repellency step is carried out continuously.

Therefore, by preheating substrate 2 to a temperature of, for example, 70–80° C., which is the final temperature of the sample stages in the first and second plasma treatment chambers 52 and 53, even in the case of continuously performing plasma treatment on a large number of substrates, plasma treatment conditions immediately after the start of treatment and immediately before completion of treatment can be maintained nearly constant. As a result, the surface treatment conditions between substrates 2 can be made to be the same, wettability relative to the composition of bank section 112 can be made to be uniform, and display apparatuses can be manufactured that have a fixed level of quality.

In addition, preheating substrate 2 makes it possible to shorten the treatment time of subsequent plasma treatment.

(2)-2 Activation Treatment

Next, activation treatment is performed in first plasma treatment chamber 52. Activation treatment includes adjustment and control of the work function in pixel electrode 111, washing of the pixel electrode surface, and lyophilic treatment of the pixel electrode surface.

Figure 7:
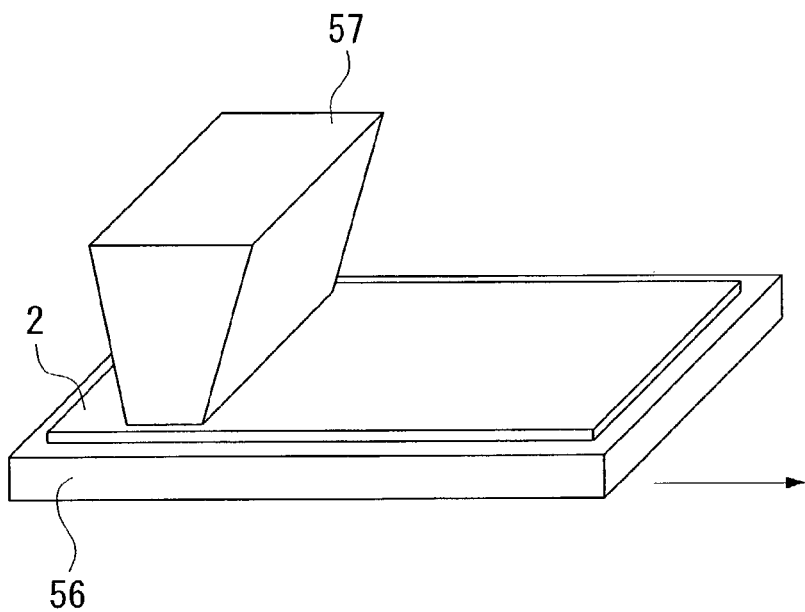
FIG. 7 is a schematic drawing showing the internal structure of a first plasma treatment chamber of the plasma treatment apparatus shown in FIG. 6.

Lyophilic treatment consists of performing plasma treatment using oxygen as the treatment gas in an atmospheric atmosphere ($O_2$ plasma treatment). FIG. 7 schematically shows the first plasma treatment. As shown in FIG. 7, substrate 2 that contains bank section 112 is placed on sample stage 56 that contains a built-in heater, and plasma discharge electrode 57 is arranged in opposition to substrate 2 at a distance of a gap of 0.5–2 mm above substrate 2. While substrate 2 is being heated by sample stage 56, sample stage 56 moves in the direction of the arrow in the drawing, and substrate 2 is transported at a prescribed transport speed. During that time, oxygen plasma is irradiated onto substrate 2.

$O_2$ plasma treatment is carried out under conditions of, for example, plasma power of 100–800 kW, oxygen gas flow rate of 50–100 ml/min, substrate transport speed of 0.5–10 mm/sec, and substrate temperature of 70–90° C. Furthermore, heating by sample stage 56 is mainly performed to maintain the temperature of the preheated substrate 2.

Figure 8:
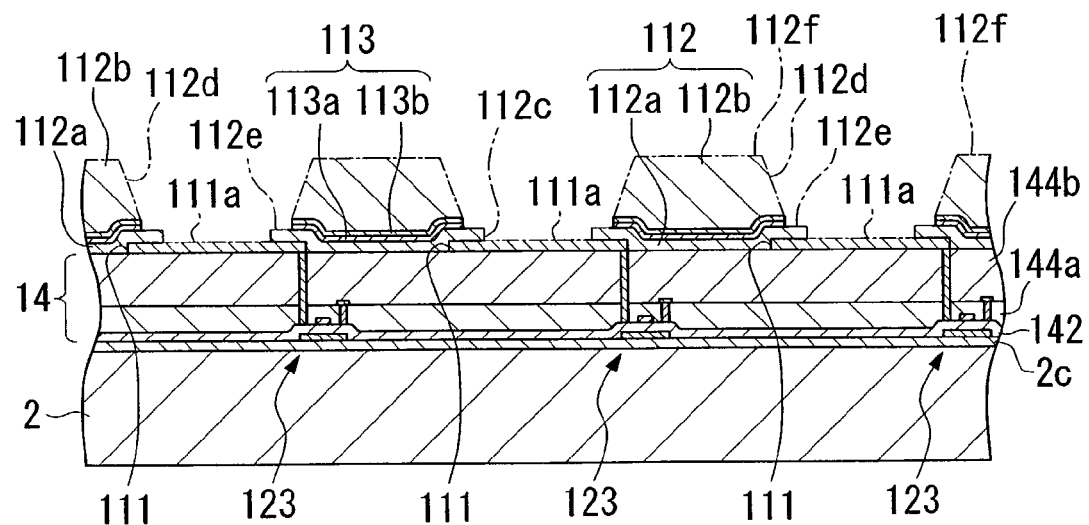
FIG. 8 is a process drawing that explains a manufacturing method of a display apparatus of a first embodiment of the present invention.

As shown in FIG. 8, as a result of this $O_2$ plasma treatment, electrode surface 111a of pixel electrode 111, first laminated section 112e of inorganic bank layer 112a as well as the wall surface and upper surface of upper opening 112d of organic bank layer 112b are subjected to lyophylic treatment. As a result of this lyophilic treatment, hydroxyl groups are introduced onto each of these surfaces to impart lyophilic properties.

Figure 9:
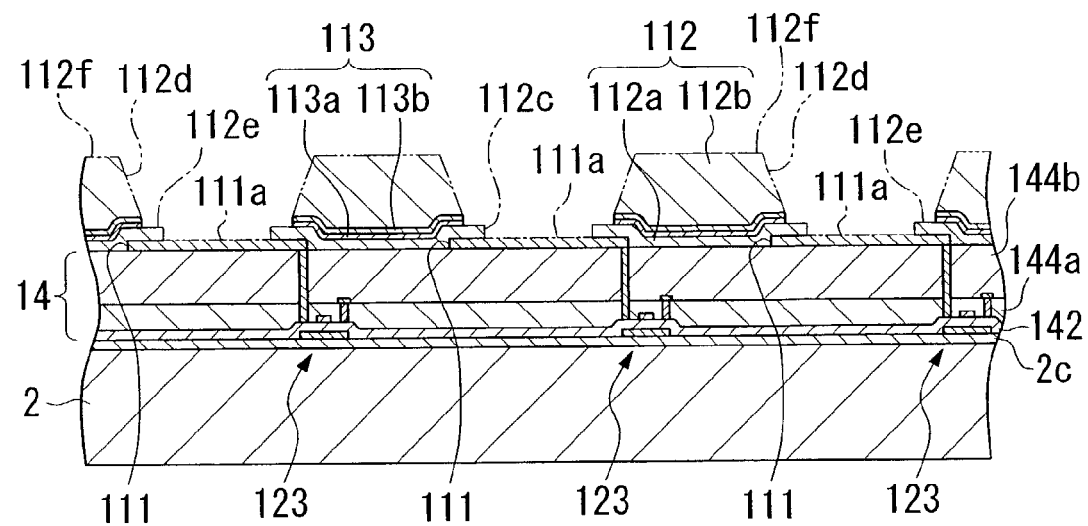
FIG. 9 is a process drawing that explains a manufacturing method of a display apparatus of a first embodiment of the present invention.

FIG. 9 shows the sections subjected to lyophilic treatment with single dotted lines.

Furthermore, this $O_2$ plasma treatment is not only performed to impart lyophilic properties, but also serves to wash the ITO serving as the pixel electrode as previously mentioned as well as adjust the work function.

(2)-3 Liquid Repellency Treatment Step

Next, plasma treatment($CF_4$ plasma treatment) is performed in which tetrafluoromethane is used as the treatment gas in an atmospheric atmosphere as the liquid repellency step in second plasma treatment chamber 53. The internal structure of second plasma treatment chamber 53 is the same as the internal structure of first plasma treatment chamber 52 shown in FIG. 7. Namely, substrate 2 is heated by a sample stage while being transported at a prescribed transport speed on the sample stage, and during that time, tetrafluoromethane plasma (carbon tetrafluoride) is irradiated onto substrate 2.

$CF_4$ plasma treatment is carried out under conditions consisting of, for example, plasma power of 100–800 kW, tetrafluoromethane gas flow rate of 50–100 ml/min, substrate transport speed of 0.5–10 mm/sec, and substrate temperature of 70–90° C. Furthermore, similar to the case of first plasma treatment chamber 52, heating by the heating stage is mainly performed to maintain the temperature of preheated substrate 2.

Furthermore, the treatment gas is not limited to tetrafluoromethane (carbon tetrafluoride), but rather other fluorocarbon-based gases may also be used.

As shown in FIG. 9, as a result of $CF_4$ plasma treatment, the wall surface of upper opening 112d and the upper surface 112f of organic bank layer 112b are treated to be liquid repellent. As a result of this liquid repellency treatment, fluorine groups are introduced onto each of these surfaces to impart them with liquid repellency. In FIG. 9, those regions exhibiting liquid repellence are indicated with double dotted lines organic substances such as the acrylic resin or polyimide resin that composes organic bank layer 112b can be easily made to be liquid repellent by irradiating with fluorocarbon plasma. In addition, pretreating with $O_2$ plasma has the characteristic of facilitating fluorination, and is particularly effective in the present embodiment.

Furthermore, although electrode surface 111a of pixel electrode 111 and first laminated section 112e of inorganic bank layer 112a are also affected to a certain extent by this $CF_4$ plasma treatment, there is little effect on wettability. In FIG. 9, those regions that exhibit lyophilic properties are indicated with single dotted lines.

(2)-4 Cooling Step

Next, for the cooling step, cooling treatment chamber 54 is used to cool substrate 2 heated for plasma treatment to a control temperature. This step is carried out to cool substrate 2 to the control temperature of the subsequent ink jet step (liquid droplet discharge step).

This cooling treatment chamber 54 has a plate for arranging substrate 2, and that plate employs a structure in which a cooling apparatus is contained so as to cool substrate 2.

In addition, by cooling substrate 2 following plasma treatment to room temperature or a prescribed temperature (such as the control temperature at which the ink jet step is carried out), the temperature of substrate 2 becomes constant in the subsequent positive hole injection/transport layer formation step, thereby enabling the next step to be carried out at a uniform temperature free of temperature changes in substrate 2. Thus, the addition of such a cooling step makes it possible to uniformly form materials that are discharged by a discharge means of an ink jet method and so forth.

For example, when discharging a first composition that contains a material for forming a positive hole injection/transport layer, the first composition can be continuously discharged at a constant volume, thereby enabling the uniform formation of a positive hole injection/transport layer.

In the above plasma treatment step, a lyophilic region and liquid repellent region can be easily provided on bank section 112 by sequentially carrying out $O_2$ plasma treatment and $CF_4$ plasma treatment on organic bank layer 112b and inorganic bank layer 112a having different materials.

Figure 10:
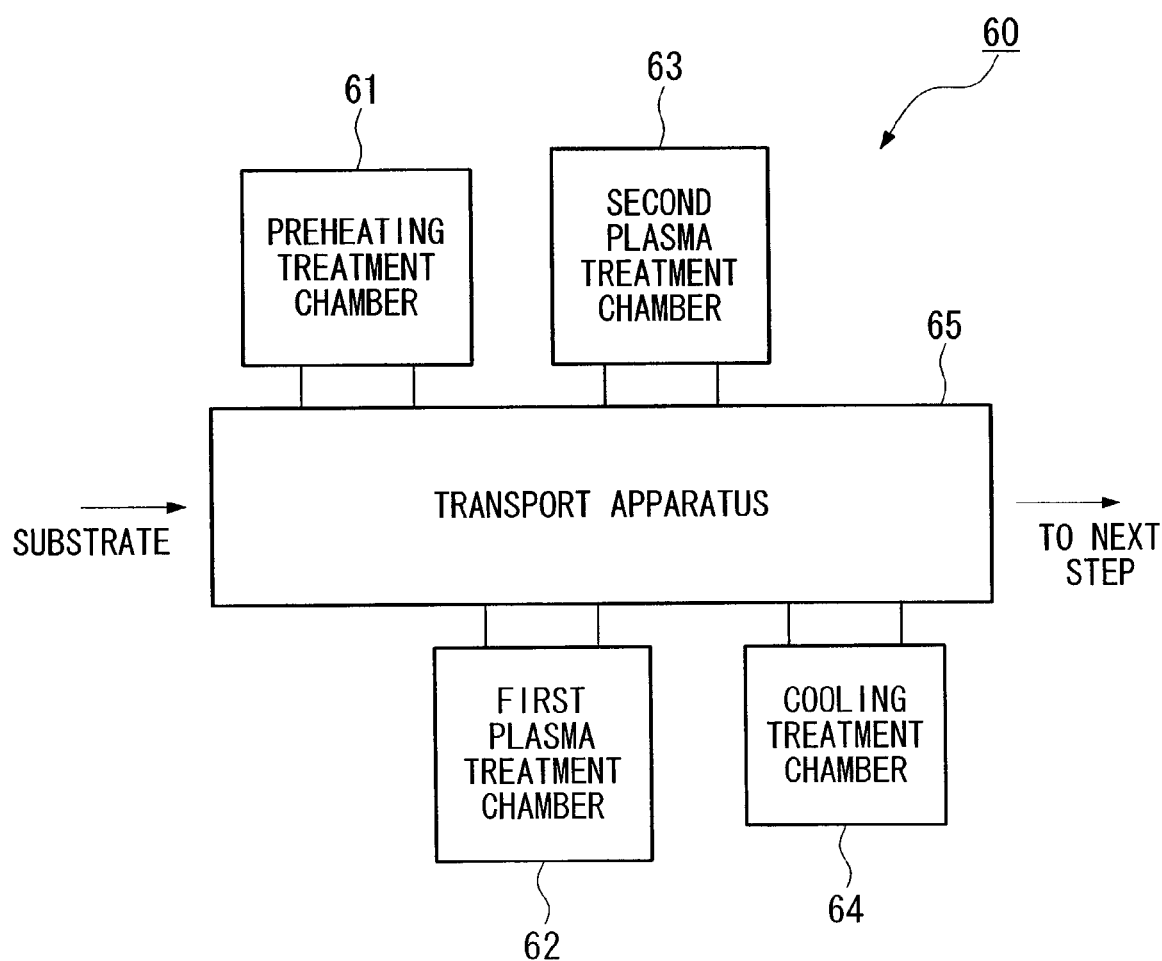
FIG. 10 is an overhead schematic drawing showing another example of a plasma treatment apparatus used for the manufacturing of a display apparatus of a first embodiment of the present invention.

Furthermore, the plasma treatment apparatus used for the plasma treatment step is not limited to that shown in FIG. 6, but rather plasma treatment apparatus 60 as shown in FIG. 10, for example, may also be used.

Plasma treatment apparatus 60 shown in FIG. 10 is composed of a preheating treatment chamber 61, first plasma treatment chamber 62, second plasma treatment chamber 63, cooling treatment chamber 64, and a transport apparatus 65 that transports substrate 2 to each of these treatment chambers 61–64, and each of these treatment chambers 61–64 is arranged on both sides in the direction of transport (on both sides in the direction of the arrows in the drawing) of transport apparatus 65.

In this plasma treatment apparatus 60, similar to the plasma treatment apparatus 50 shown in FIG. 6, substrate 2 transported from the bank section formation step is sequentially transported to preheating treatment chamber 61, first and second plasma treatment chambers 62 and 63, and cooling treatment chamber 64, and after undergoing treatment similar to that previously described in each treatment chamber, substrate 2 is transported to the next positive hole injection/transport layer formation step.

In addition, the above plasma apparatus does not have to be an apparatus operating at atmospheric pressure, but rather a vacuum plasma apparatus may also be used.

(3) Positive Hole Injection/Transport Layer Formation Step

Next, a positive hole injection/transport layer is formed on an electrode (here, pixel electrode 111) in the luminescent element formation step.

In the positive hole injection/transport layer formation step, by using, for example, an ink jet apparatus for discharge of liquid droplets, a first composition(composition) containing a positive hole-injection/transport layer forming material is discharged onto electrode surface. Subsequently, drying treatment and heat treatment are carried out, and positive hole injection/transport layer 110a is formed on pixel electrode 111 and inorganic bank layer 112a. Furthermore, the inorganic bank layer 112a on which positive hole injection/transport layer 110a is formed is referred to here as first laminated section 112e.

This positive hole injection/transport layer formation step and following steps are preferably carried out in an atmosphere free of water and oxygen. For example, they are preferably carried out in an inert gas atmosphere such as a nitrogen atmosphere or argon atmosphere.

Furthermore, positive hole injection/transport layer 110a does not have to be formed on first laminated section 112e. Namely, positive hole injection/transport layer 110a may only be formed on pixel electrode 111.

The manufacturing method using an ink jet is as described below.

Figure 11:
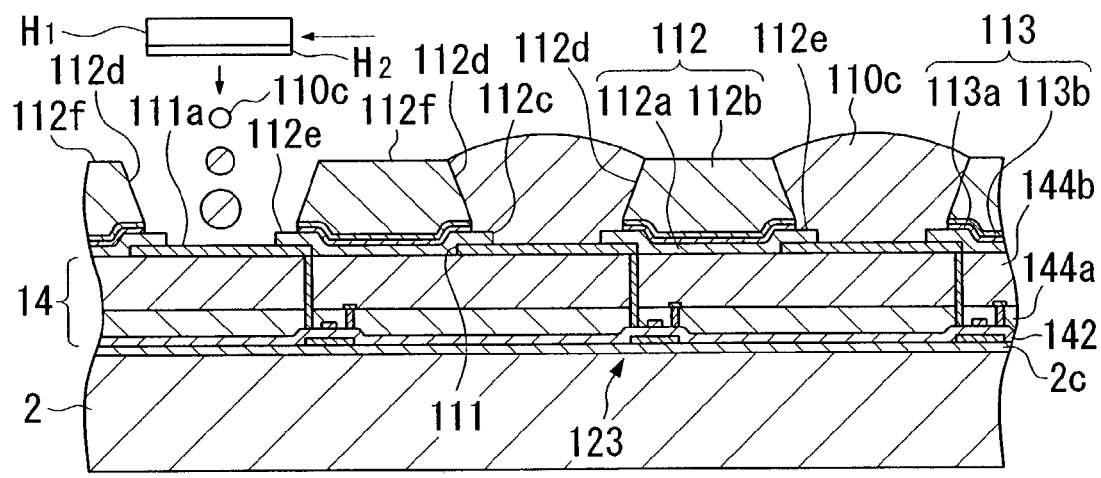
FIG. 11 is a process drawing that explains a manufacturing method of a display apparatus of a first embodiment of the present invention.

As shown in FIG. 11, a first composition containing a positive hole injection/transport layer forming material is discharged from a plurality of nozzles formed in ink jet head H1. Here, although the composition is filled into each pixel by scanning of the ink jet head, this may also be performed by scanning of substrate 2. Moreover, the composition may also be filled by moving the ink jet head and substrate 2 relative to each other. Furthermore, this applies similarly to subsequent steps in which an ink jet head is used.

Discharge by the ink jet head is carried out as described below. Namely, discharge nozzle H2 formed in ink jet head H1 is arranged in opposition to electrode surface 111a, and a first composition is discharged from nozzle H2. Bank 112 that divides lower opening 112c is formed around electrode surface 111a, ink jet head H1 is opposed to pixel electrode surface 111a located within this lower opening 112c, and first composition droplets 110c, for which the amount of liquid per drop is controlled, are discharged from discharge nozzle H2 onto electrode surface 111a while this ink jet head H1 and substrate 2 move relative to each other.

A composition in which a mixture of, for example, a polythiophene derivative such as polyethylenedioxythiophene (PEDOT) and polystyrene sulfonic acid (PSS) and the like is dissolved in a polar solvent may be used for the first composition used here. Examples of polar solvents include isopropyl alcohol (IPA), normal alcohol, γ-butyrolactone, N-methylpyrrolidone (NMP), 1,3-dimethyl-2-imidazolidinone (DMI) and its derivatives, and glycol ethers such as carbitol acetate and butylcarbitol acetate.

A more specific example of the composition of this first composition is 12.52% by weight of a PEDOT/PSS mixture (PEDOT/PSS=1:20), 1.44% by weight of PSS, 10% by weight of IPA, 27.48% by weight of NMP and 50% by weight of DMI. Furthermore, the viscosity of the first composition is preferably about 2–20 cPs, and particularly preferably 4–15 cPs.

As a result of using the above first composition, discharge can be carried out stably without the occurrence of clogging in discharge nozzle H2.

Furthermore, the positive hole injection/transport layer forming material may use the same material for each of red (R), green (G) and blue (B) luminescent layers 110b1 through 110b3, or the material may be changed for each luminescent layer.

As shown in FIG. 11, discharged first composition droplets 110c spread over lyophilic treated electrode surface 111a and fist laminated section 112e, and are filled into lower and upper openings 112c and 112d. Even if first composition droplets 110c shift from the prescribed discharge location and are discharged onto upper surface 112f, the repelled first composition droplets 110c roll into lower and upper openings 112c and 112d without upper surface 112f overflowing with first composition droplets 110c.

The amount of the first composition discharged onto electrode surface 111a is determined by the sizes of lower and upper openings 112c and 112d, the thickness of the positive hole injection/transport layer attempting to be formed, the concentration of the positive hole injection/transport layer forming material within the first composition and so forth.

In addition, first composition droplets 110c may not only be discharged onto the same electrode surface 111a once, but also by dividing into a plurality of discharges. In this case, the amount of the first composition during each discharge may be the same, or the amount of the first composition may be changed each time. Moreover, the first composition may not only be discharged at the same location on electrode surface 111a, but may also be discharged at different locations on electrode surface 111a each time.

Figure 14:
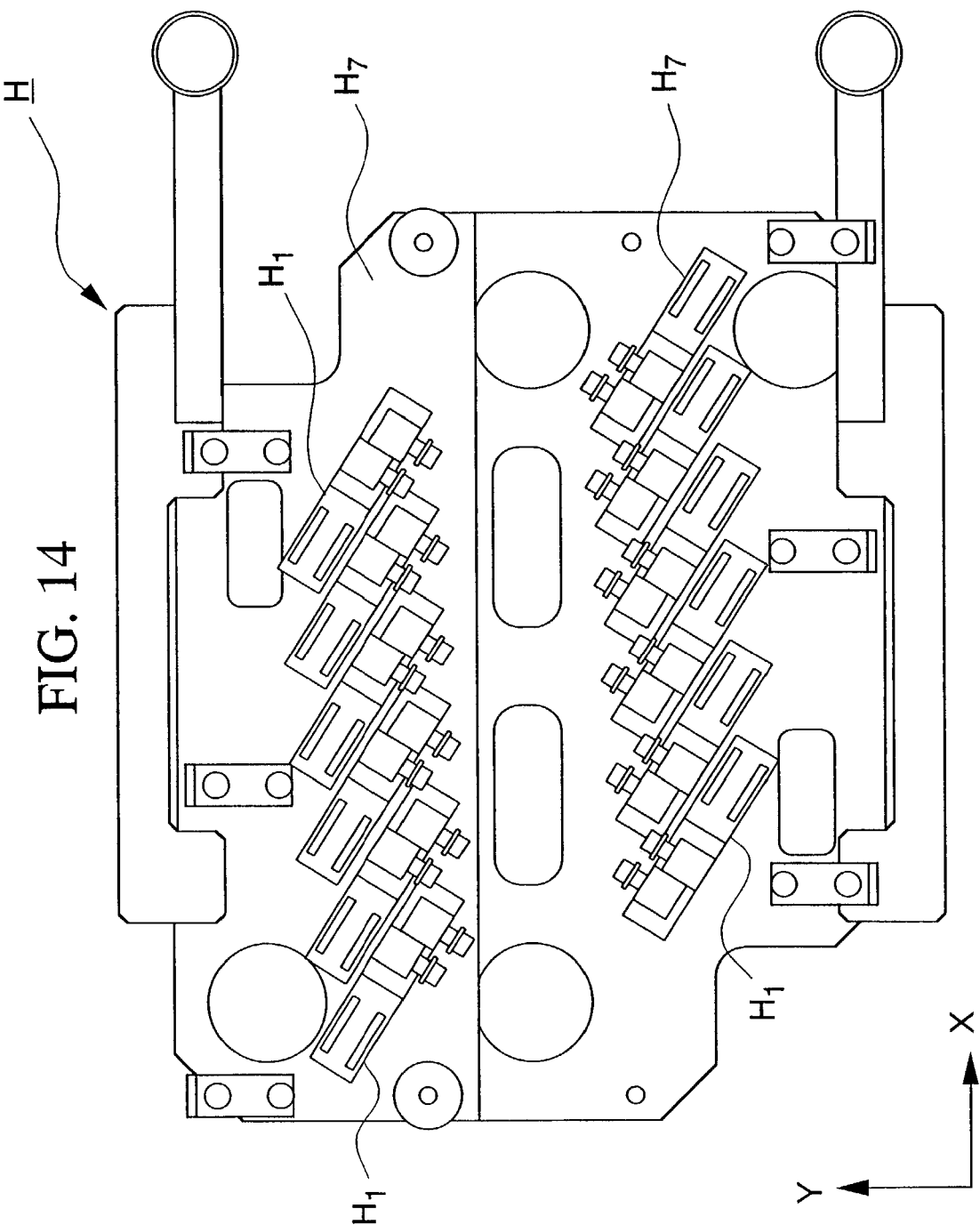
FIG. 14 is an overhead view showing a head used during manufacturing of a display apparatus of a first embodiment of the present invention.
Figure 15:
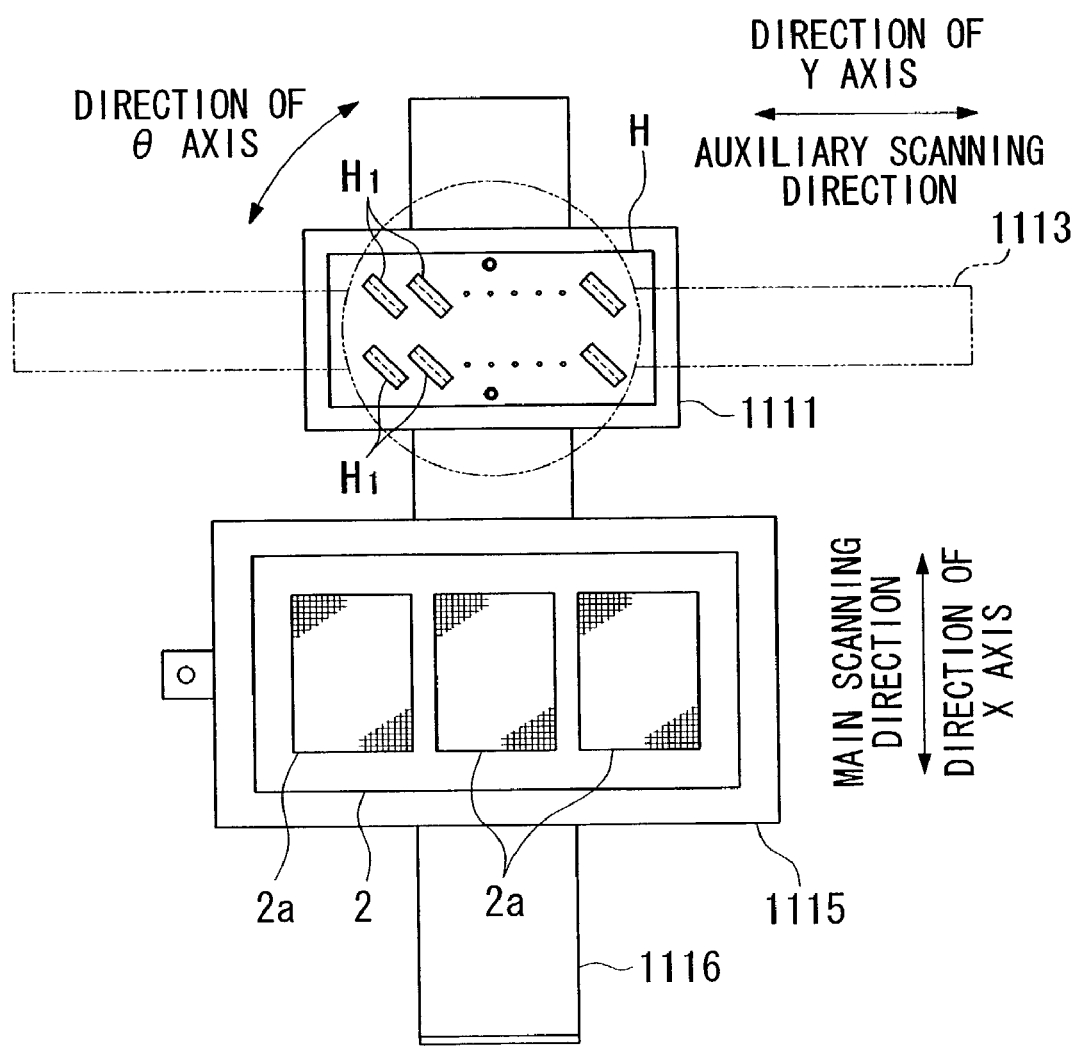
FIG. 15 is an overhead view showing an ink jet apparatus used during manufacturing of a display apparatus of a first embodiment of the present invention.

With respect to the structure of the ink jet head, a head H like that shown in FIG. 14 may be used. Moreover, the substrate and ink jet head are preferably arranged as shown in FIG. 15. In FIG. 14, reference symbol H7 represents a support substrate that supports the above ink jet head H1, and a plurality of ink jet heads H1 are provided on this support substrate H7.

A plurality of discharge nozzles are provided in the ink discharge surface (surface in opposition to the substrate) of ink jet head H1 arranged in rows along the lengthwise direction of the head and arranged in two rows at an interval in the widthwise direction of the head (for example, 180 nozzles per row for a total of 360 nozzles). In addition, together with the discharge nozzles facing towards the substrate, a plurality of these ink jet heads H1 (6 per row for a total of 12 in FIG. 14) are positioned and supported by a roughly rectangular support plate 20 when viewed from overhead in rows along roughly the direction of the X axis inclined at a prescribed angle relative to the X axis (or Y axis), and arranged in two rows at a prescribed interval in the direction of the Y axis.

In addition, in the ink jet apparatus shown in FIG. 15, reference symbol 1115 represents a stage on which substrate 2 is placed, while reference symbol 1116 represents a guide rail that guides stage 1115 in the direction of the X axis in the drawing (main scanning direction). In addition, head H is able to move in the direction of the Y axis in the drawing (auxiliary scanning direction) according to guide rail 1113 via support member 1111, head H is able to rotate in the direction of the θ axis in the drawing, and the ink jet heads H1 can be inclined at a prescribed angle relative to the main scanning direction. In this manner, by arranging the ink jet heads by inclining relative to the scanning direction, nozzle pitch can be made to correspond to the pixel pitch. In addition, by adjusting the angle of inclination, the nozzle pitch can be made to correspond to any pixel pitch.

Substrate 2 shown in FIG. 15 has a structure in which a plurality of chips are arranged on a mother board. Namely, the region of 1 chip corresponds to a single display apparatus. Although three display regions 2a are formed here, the number of display regions is not limited to three. For example, in the case of coating a composition for display region 2a on the left side of substrate 2, together with moving head H to the left side in the drawing by means of guide rail 1113, substrate 2 is moved upward in the drawing by means of guide rail 1116, and coating is performed while scanning substrate 2. Next, head H is moved to the right in the drawing to coat the composition for the central display region 2a of the substrate. This applies similarly to display area 2a on the right end of the substrate.

Furthermore, the head H shown in FIG. 14 and the ink jet apparatus shown in FIG. 15 may be used not only in the positive hole injection/transport layer formation step, but also in the luminescent layer formation step.

Figure 12:
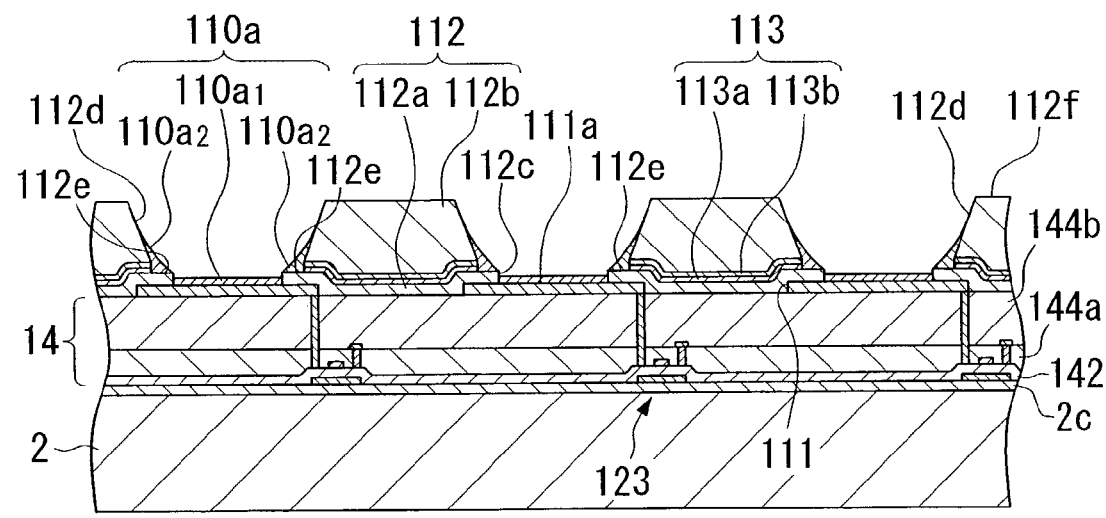
FIG. 12 is a process drawing that explains a manufacturing method of a display apparatus of a first embodiment of the present invention.

Next, a drying step like that shown in FIG. 12 is carried out. As a result of carrying out this drying step, the first composition following discharge is dried, the polar solvent contained in the first composition is evaporated, and positive hole injection/transport layer 110a is formed.

When drying treatment is carried out, evaporation of the polar solvent contained in first composition droplets 110c mainly occurs near inorganic bank layer 112a and organic bank layer 112b, and together with this evaporation of polar solvent, positive hole injection/transport layer forming material is concentrated and precipitates.

Figure 13:
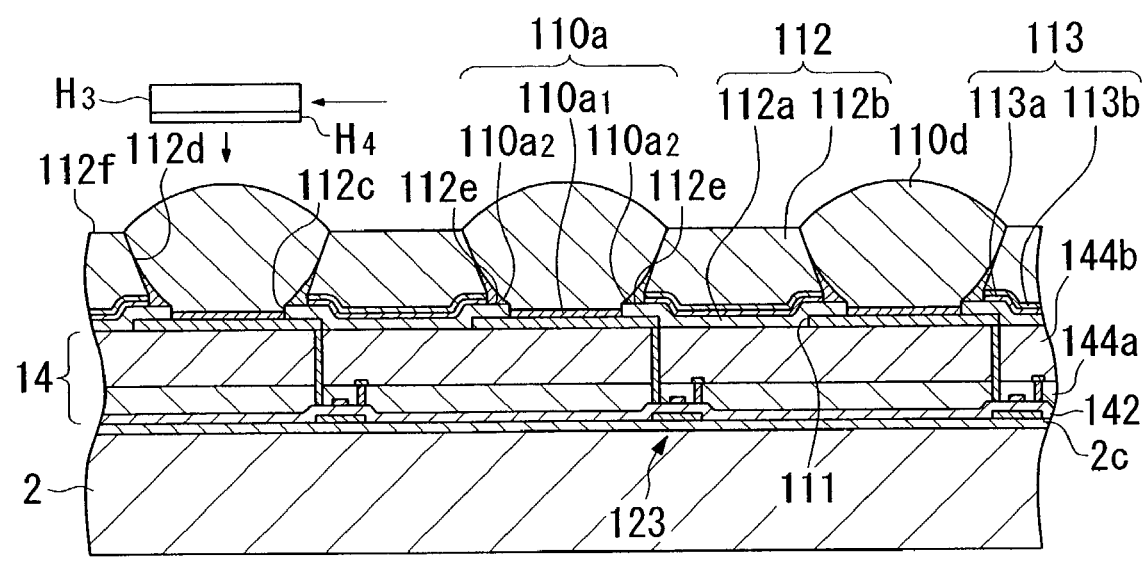
FIG. 13 is a process drawing that explains a manufacturing method of a display apparatus of a first embodiment of the present invention.

As a result, as shown in FIG. 13, peripheral edge section 110a2 composed of positive hole injection/transport layer forming material is formed on first laminated section 112e. This peripheral edge section 110a2 is tightly adhered to the wall surface of upper opening 112d (organic bank layer 112b), and its thickness is thinner closest to electrode surface 111a, and thicker farthest from electrode surface 111a, namely closest to organic bank layer 112b.

In addition, simultaneous to this, evaporation of polar solvent also occurs on electrode surface 111a due to drying treatment, and as a result, flat section 110a1 composed of positive hole injection/transport layer forming material is formed on electrode surface 111a. Since the evaporation rate of polar solvent is nearly uniform on electrode surface 111a, the material that forms the positive hole injection/transport layer is concentrated uniformly, thereby resulting in the formation of a flat section 110a1 of uniform thickness.

In this manner, positive hole injection/transport layer 110a is formed that is composed of peripheral edge section 110a2 and flat section 110a1.

Furthermore, the positive hole injection/transport layer may only be formed on electrode surface 111a without being formed on peripheral edge section 110a2.

The above drying treatment is carried out in, for example, a nitrogen atmosphere at room temperature and at a pressure of, for example, 133.3 Pa (1 Torr). If the pressure is too low, first composition droplets 110c end up bumping, which is not desirable. In addition, if the temperature is higher than room temperature, the evaporation rate of the polar solvent increases, thereby preventing the formation of a flat film.

Following drying treatment, any polar solvent or water remaining in positive hole injection/transport layer 110a is preferably removed by carrying out heat treatment by heating for about 10 minutes at a temperature of 200° C. in nitrogen, and preferably in a vacuum.

In the above positive hole injection/transport layer formation step, while the discharged first composition droplets 110c are filled into lower and upper openings 112c and 112d, the first composition is repelled by liquid repellency treated organic bank layer 112b, causing it to roll into lower and upper openings 112c and 112d. As a result, the discharged first composition droplets 110c can always be filled into upper and lower openings 112c and 112d, enabling positive hole injection/transport layer 110a to be formed on electrode surface 111a.

(4) Luminescent Layer Formation Step

Next, the luminescent layer formation step is composed of a surface modification step, a luminescent layer forming material discharge step and a drying step.

To begin with, a surface modification step is carried out to modify the surface of positive hole injection/transport layer 110a. The details of this step will be described later. Next, similar to the previously mentioned positive hole injection/transport layer formation step, a second composition is discharged onto positive hole injection/transport layer 110a by an ink jet method. Subsequently, the discharged second composition is subjected to drying treatment (and heat treatment) to form luminescent layer 110b on positive hole injection/transport layer 110a.

In the luminescent layer formation step, a non-polar solvent that is insoluble with respect to positive hole injection/transport layer 110a is used for the solvent of the second composition used during formation of the luminescent layer to prevent positive hole injection/transport layer 110a from redissolving.

On the other hand, however, since positive hole injection/transport layer 110a has low affinity for non-polar solvents, even if the second composition containing a non-polar solvent is discharged onto positive hole injection/transport layer 110a, there is the risk of it either being no longer able to cause positive hole injection/transport layer 110a and luminescent layer 110b to be adhered, or allow luminescent layer 110b to be coated uniformly.

Therefore, a surface modification step is carried out prior to formation of the luminescent layer to enhance the affinity of the surface of positive hole injection/transport layer 110a to non-polar solvent and the luminescent layer forming material.

The following provides an explanation of the surface modification step.

The surface modification step is carried out by coating a surface modifier in the form of the same or similar solvent as the non-polar solvent of the second composition used during luminescent layer formation onto positive hole injection/transport layer 110a by the ink jet method (liquid droplet discharge method), spin coating or dipping, followed by drying.

As shown in FIG. 13, coating using the ink jet method is carried out by filling the surface modifier into ink jet head H3, and discharging the surface modifier from discharge nozzles H4 formed in ink jet head H3. Similar to the previously mentioned positive hole injection/transport layer formation step, discharge nozzles H4 are in opposition to substrate 2 (namely, substrate 2 on which positive hole injection/transport layer 110a is formed), and surface modifier 110d is discharged from discharge nozzles H4 onto positive hole injection/transport layer 110a while moving ink jet head H3 and substrate 2 relative to each other.

In addition, coating by spin coating is carried out by placing substrate 2 on, for example, a rotary stage, dropping the surface modifier onto substrate 2 from above, and then rotating substrate 2 to spread the surface modifier over the entire surface of positive hole injection/transport layer 110a on substrate 2. Furthermore, although the surface modifier is temporarily spread over the liquid repellency treated upper surface 112f, since surface modifier is repelled from upper surface 112f when the substrate is lifted up, surface modifier is only coated on positive hole injection/transport layer 110a.

Moreover, coating by the dipping method is carried out by, for example, immersing substrate 2 in a surface modifier and then lifting it out to spread the surface modifier over the entire surface of positive hole injection/transport layer 110a. In this case as well, although the surface modifier typically spreads over the liquid repellency treated upper surface 112f, the surface modifier is repelled from upper surface 112f when the substrate is lifted out, and is only coated onto positive hole injection/transport layer 110a.

The surface modifier used here is the same as the non-polar solvent of the second composition, examples of which include cyclohexylbenzene, dihydrobenzofuran, trimethylbenzene and tetramethylbenzene, while those similar to the non-polar solvent of the second composition include, for example, toluene and xylene.

In particular, in the case of coating using the ink jet method, dihydrobenzofuran, trimethylbenzene, tetramethylbenzene, cyclohexylbenzene or mixtures thereof, and particularly the same solvent mixture as the second composition, are preferably used, while toluene, xylene and so forth are preferably used in the case of coating by spin coating or dipping.

Figure 16:
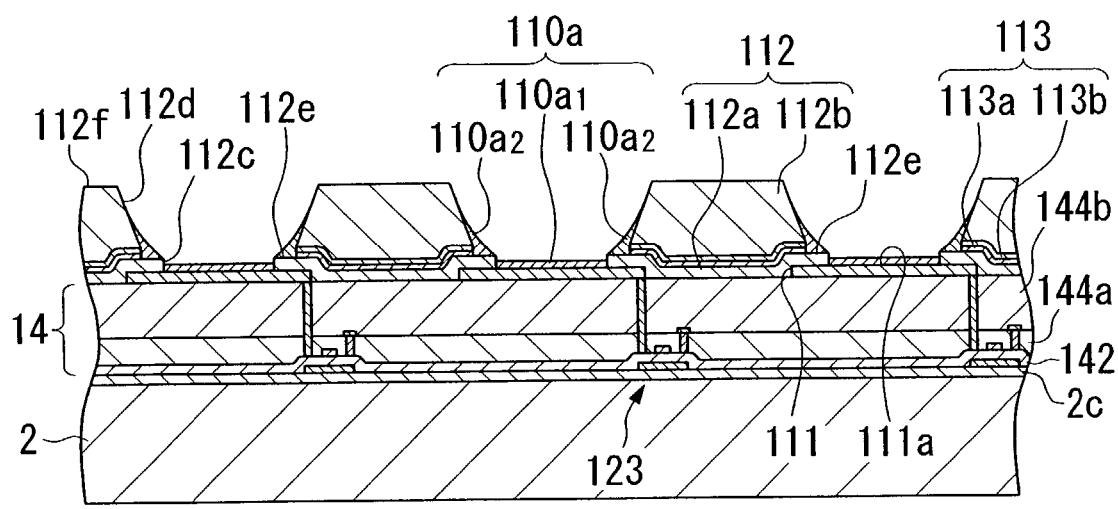
FIG. 16 is a process drawing that explains a manufacturing method of a display apparatus of a first embodiment of the present invention.

Next, as shown in FIG. 16, the coated region is dried. This drying step is preferably carried out in the case of coating using the ink jet method by placing substrate 2 on a hot plate and drying to evaporation by heating at a temperature of, for example, 200° C. or lower. In the case of coating by spin coating or dipping, drying is preferably carried out by either blowing nitrogen onto substrate 2, or by rotating the substrate and generating air flow over the surface of substrate 2.

Furthermore, coating of surface modifier may be carried out after drying treatment of the positive hole injection/transport layer formation step, and heat treatment of the positive hole injection/transport layer formation step may be carried out after drying the surface modifier following coating.

As a result of performing this surface modification step, the surface of positive hole injection/transport layer 110a is given greater affinity to non-polar solvent, and the second composition containing the luminescent layer forming material can be uniformly coated onto positive hole injection/transport layer 110a in the subsequent step.

Furthermore, an extremely thin positive hole transport layer may also be formed on the positive hole injection/transport layer by dissolving the above-mentioned compound and so forth typically used as a positive hole transport material to form a composition and using that composition for the above surface modifier, followed by coating this composition onto the positive hole injection/transport layer by the ink jet method followed by drying.

Although the majority of the positive hole injection/transport layer is dissolved into luminescent layer 110b that is coated in the following step, a portion remains in the form of a thin film between positive hole injection/transport layer 110a and luminescent layer 110b, and as a result, luminescent efficiency can be improved by facilitating movement of positive holes as a result of lowering the energy barrier between positive hole injection/transport layer 110a and luminescent layer 110b.

Next, for the luminescent layer formation step, luminescent layer 110b is formed on positive hole injection/transport layer 110a by discharging the second composition containing luminescent layer forming material onto positive hole injection/transport layer 110a by the ink jet method (liquid droplet discharge method) followed by drying treatment.

Figure 17:
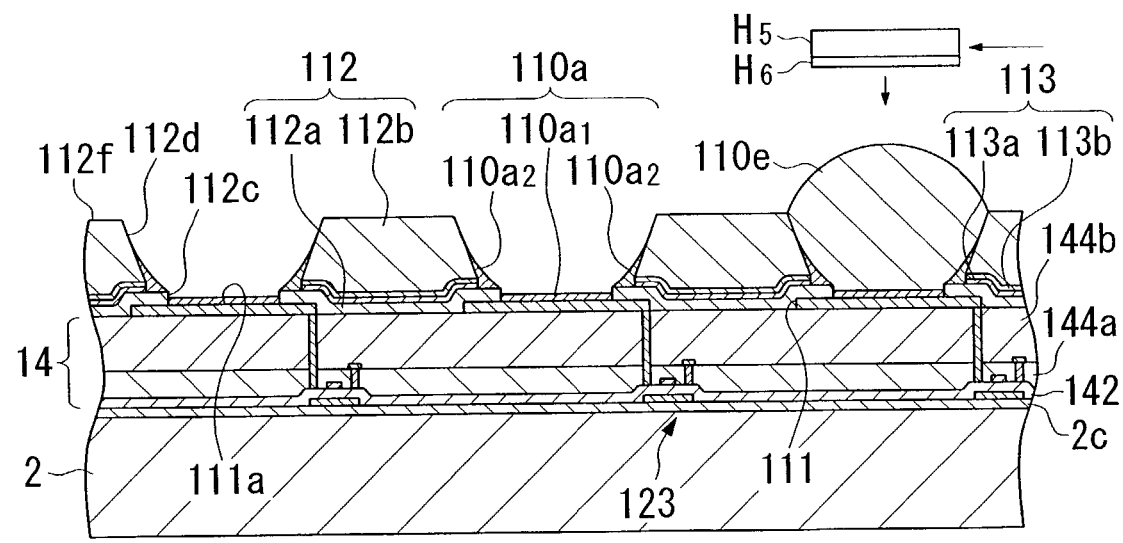
FIG. 17 is a process drawing that explains a manufacturing method of a display apparatus of a first embodiment of the present invention.

FIG. 17 shows the discharge method according to the ink jet method. As shown in FIG. 17, the second composition containing each color (here, blue (B)) of luminescent layer forming material is discharged from discharge nozzles H6 formed in an ink jet head H5 while moving ink jet head H5 and substrate 2 relative to each other.

During discharge, the second composition is discharged while positioning the discharge nozzles in opposition to positive hole injection/transport layer 110a located in lower and upper openings 112c and 112d, and moving ink jet head H5 relative to substrate 2. The amount of liquid discharged from discharge nozzles H6 is controlled per drop. Liquid for which the amount has been controlled in this manner (second composition droplets 110e) is then discharged from the discharge nozzles, and these second composition droplets 110e are discharged onto positive hole injection/transport layer 110a.

The polyfluorene-based polymer derivatives (poly)paraphenylene vinylene derivatives, polyphenylene derivatives, polyvinylcarbazole, polythiophene derivatives, polythiophene derivatives, perylene pigment, coumarin pigment, rhodamine pigment or their polymers doped with organic EL materials shown in Compounds 1 through 5 indicated with the previously mentioned structural formulas can be used for the luminescent layer forming material. Examples of materials that can be used for doping include rubrene, perylene, 9,10-diphenylanthracene, tetraphenylbutadiene, Nile red, coumarin 6 and quinacrylidone.

Preferable non-polar solvents that can be used include those which are insoluble with respect to positive hole injection/transport layer 110a, examples of which include cyclohexylbenzene, dihydrobenzene, trimethylbenzene and tetramethylbenzene.

As a result of using such non-polar solvents in the second composition of luminescent layer 110b, the second composition can be coated without causing positive hole injection/transport layer 110a to be redissolved.

As shown in FIG. 17, the discharged second composition 110e is filled into lower and upper openings 112c and 112d by spreading over positive hole injection/transport layer 110a. On the other hand, even if second composition droplets 110e shift from the prescribed discharge location and are discharged onto upper surface 112f, second composition droplets 110e roll into lower and upper openings 112c and 112d without dampening upper surface 112f.

The amount of the second composition that is discharged onto each positive hole injection/transport layer 110a is determined according to the sizes of lower and upper openings 112c and 112d, the thickness of the luminescent layer 110b to be formed, and the concentration of the luminescent layer material in the second composition and so forth.

In addition, the second composition 110e may be discharged not only once, but also discharged over the course of several times onto the same positive hole injection/transport layer 110a. In this case, the amount of the second composition for each discharge may be the same or the liquid amount of the second composition may be changed for each discharge. Moreover, the second composition may not only be discharged at the same location of positive hole injection/transport layer 110a, but also the second composition may be discharged at different locations within positive hole injection/transport layer 110a for each discharge.

Figure 18:
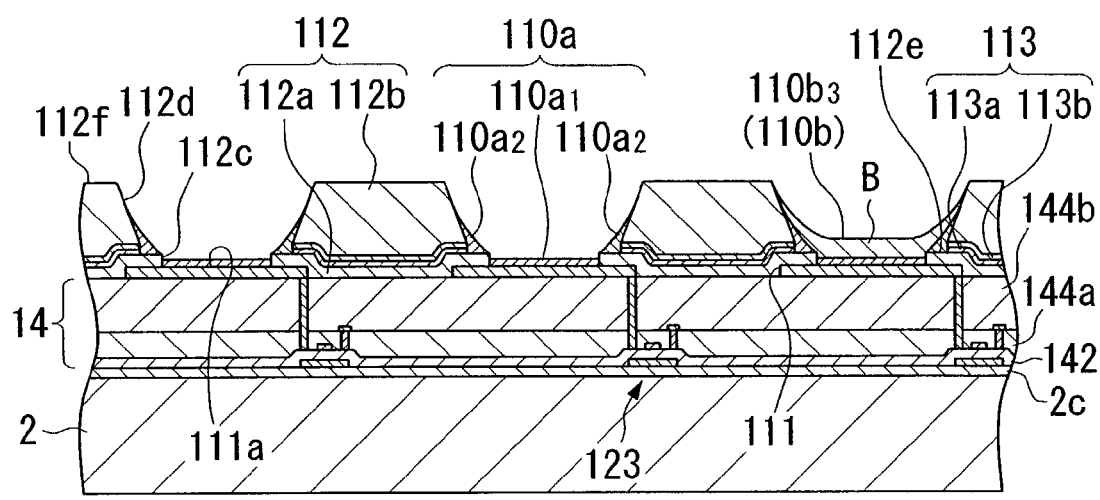
FIG. 18 is a process drawing that explains a manufacturing method of a display apparatus of a first embodiment of the present invention.

Next, after the second composition has finished being discharged at the prescribed location, luminescent layer 110b3 is formed by subjecting the second composition droplets 110e following discharge to drying treatment. Namely, the non-polar solvent contained in the second composition is evaporated by drying, and blue (B) luminescent layer 110b3 is formed as shown in FIG. 18. Furthermore, although only one luminescent layer 110b3 that emits blue light is shown in FIG. 18, as is clear from FIG. 1 and the other drawings, since luminescent elements are inherently formed in the form of a matrix, a large number of luminescent layers (corresponding to blue color) not shown are also formed.

Figure 19:
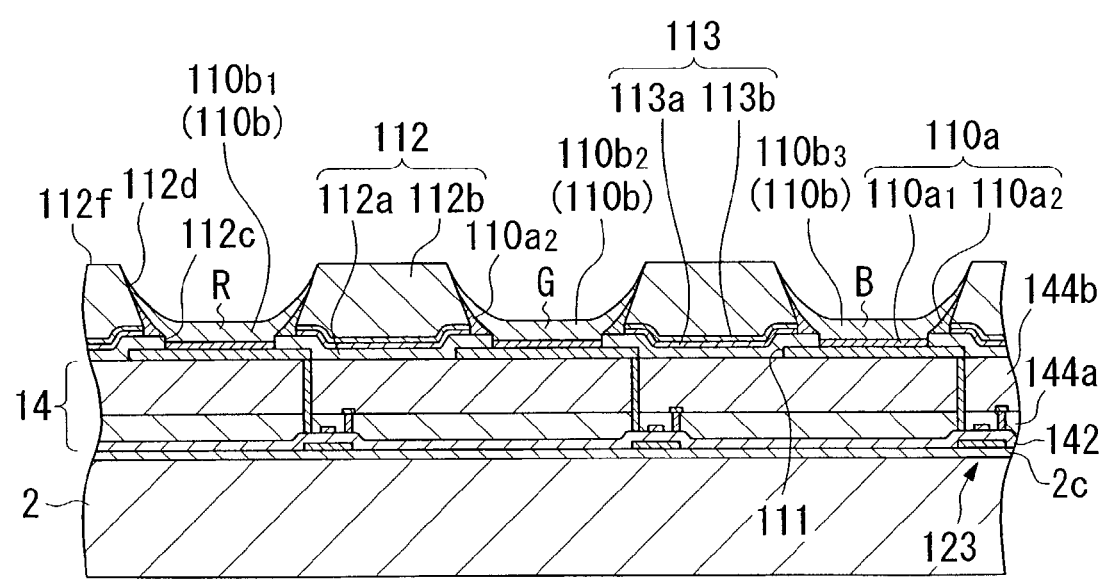
FIG. 19 is a process drawing that explains a manufacturing method of a display apparatus of a first embodiment of the present invention.

Continuing, as shown in FIG. 19, red (R) luminescent layer 110b1 is formed, and finally a green (G) luminescent layer 110b2 is formed, using a step that is similar to the case of the previously mentioned blue (B) luminescent layer 110b3.

Furthermore, there are no particular restrictions on the previously mentioned order in which luminescent layers 110b are formed, and they may be formed in any order. For example, the order in which they are formed may be determined according to the luminescent layer forming materials.

In addition, the drying of the second composition of the luminescent layer is carried out under conditions of, in the case of blue luminescent layer 110b3 for example, a pressure of 133.3 Pa (1 Torr) at room temperature and in a nitrogen atmosphere for about 5–10 minutes. If the pressure is too low, first composition droplets 110c end up bumping, which is not desirable. In addition, if the temperature is higher than room temperature, the evaporation rate of the polar solvent increases, thereby causing excessive adhesion of the luminescent layer forming material to the wall surface of upper opening 112d, which is also not desirable.

In addition, in the case of green luminescent layer 110b2 and red luminescent layer 110b1, drying is preferably carried out rapidly due to the large number of luminescent layer forming material components, and drying is preferably carried out under conditions of, for example, blowing nitrogen at a temperature of 40° for 5–10 minutes.

Examples of other drying means include far infrared irradiation and blowing of high-temperature nitrogen gas.

In this manner, positive hole injection/transport layer 110a and luminescent layer 110b are formed on pixel electrode 111.

(5) Counter Electrode (Cathode) Formation Step

Figure 20:
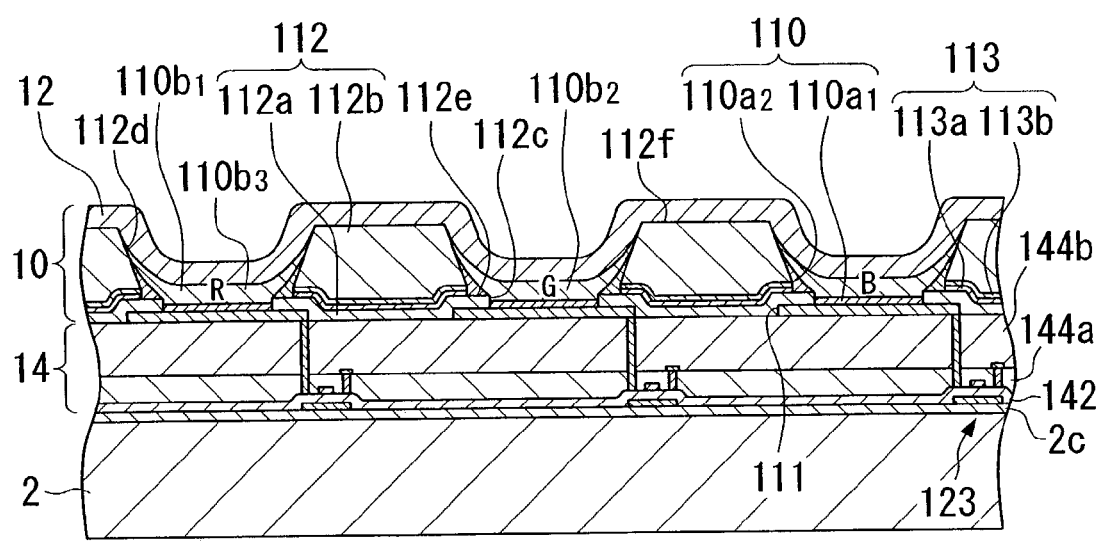
FIG. 20 is a process drawing that explains a manufacturing method of a display apparatus of a first embodiment of the present invention.

Next, in the counter electrode formation step, as shown in FIG. 20, cathode 12 (counter electrode) is formed over the entire surface of luminescent layer 110b and organic bank layer 112b. Furthermore, cathode 12 may be formed by laminating a plurality of materials. For example, a material having a small work function is preferably formed on the side near the luminescent layer, and a material such as Ca or Ba may be used. In addition, there are also cases in which it is better to form a thin layer of LiF and so forth for the lower layer depending on the material. In addition, a material having a higher work function than the lower side, such as Al, may also be used for the upper side (sealing side).

These cathodes 12 are preferably formed by, for example, sputtering or CVD, and formation by vapor deposition in particular is preferably with respect to being able to prevent damage to luminescent layer 110b by heat.

In addition, lithium fluoride may only be formed on luminescent layer 110b, and may be formed corresponding to a prescribed color. For example, it may only be formed on blue (B) luminescent layer 110b3. In this case, upper cathode layer 12b composed of calcium makes contact with the other red (R) and green (G) luminescent layers 110b1 and 110b2.

In addition, an Al film or Ag film and so forth formed by vapor deposition, sputtering or CVD is preferably used for the upper section of cathode 12. In addition, its thickness is preferably within the range of, for example, 100–1000 nm, and is particularly preferably 200–500 nm.

In addition, a protective layer of $SiO_2$ or SiN and so forth may also be provided on cathode 12 for protecting against oxidation.

(6) Sealing Step

Finally, the sealing step is a step in which substrate 2 on which luminescent elements are formed and sealing substrate 3b are sealed with a sealing resin. For example, sealing resin 3a composed of a thermosetting resin or ultraviolet setting resin is coated over the entire surface of substrate 2, and sealing substrate 3b is laminated onto sealing resin 3a. Sealing section 3 is formed on substrate 2 by this step.

The sealing step is preferably carried out in an inert gas atmosphere such as nitrogen, argon or helium. If it is carried out in air, in the case pin holes or other defects have occurred in cathode 12, water or oxygen and so forth penetrate into cathode 12 from these defect sections resulting in the risk of oxidation of cathode 12, which is not desirable.

Moreover, together with cathode 12 being connected to wiring 5a of substrate 5 shown in FIG. 2, by also connecting the wiring of circuit element section 14 to drive IC 6, display apparatus 1 of the present embodiment is obtained.

[Second Embodiment]

Next, an explanation is provided of a second embodiment of the present invention with reference to the drawings.

Figure 21:
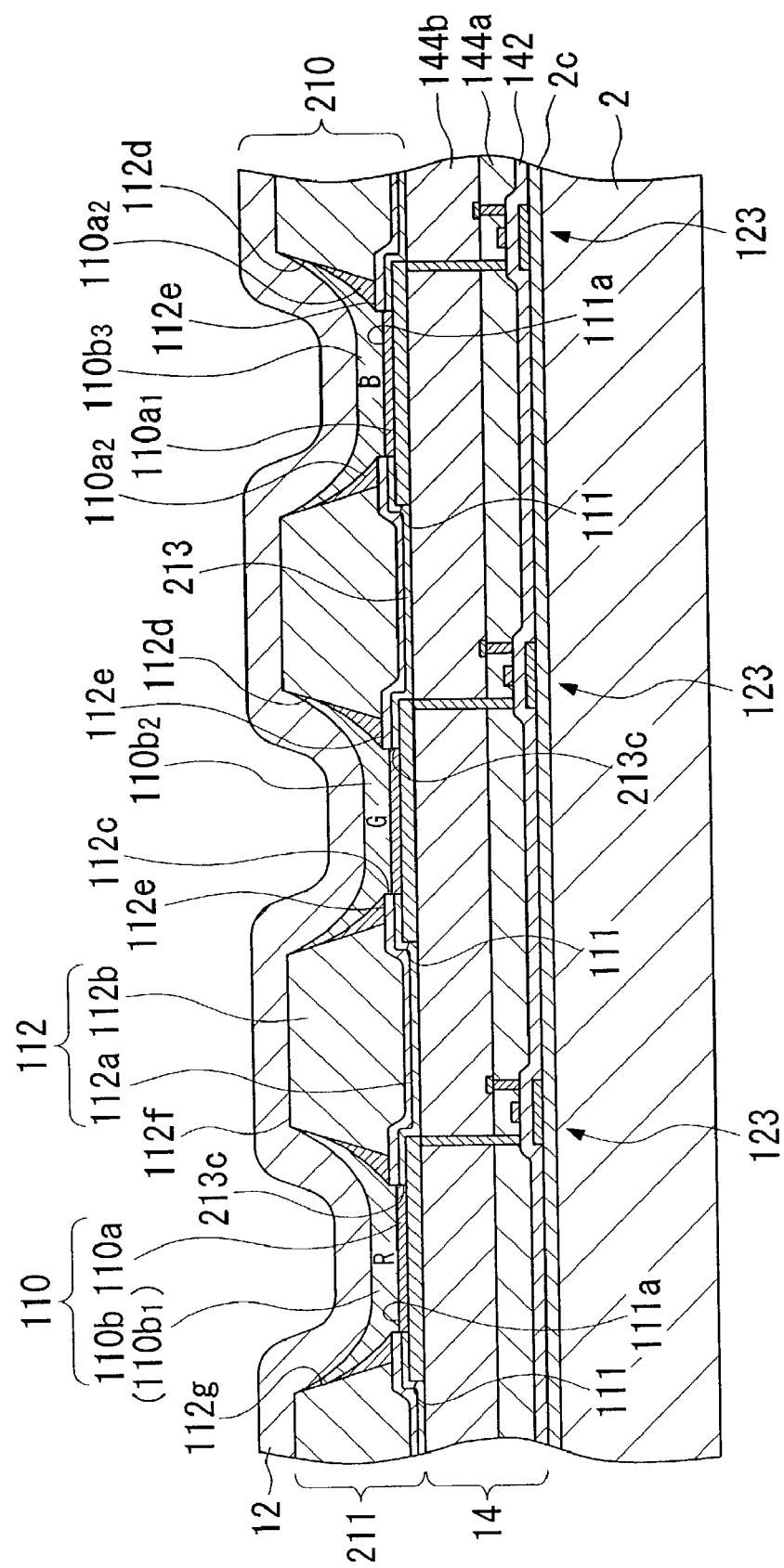
FIG. 21 is a drawing showing the essential portion of a display apparatus of a second embodiment of the present invention.

FIG. 21 is a cross-sectional view showing the essential portion of a display apparatus of the second embodiment.

As shown in FIG. 21, the display apparatus of the present embodiment is composed by sequentially laminating a circuit element section 14 in which TFT and other circuits are formed, luminescent element section 211 in which a luminescent layer is formed, and cathode 12 on a substrate 2.

In the display apparatus as claimed in the present embodiment, similar to the case of the first embodiment, light emitted from functional layer 110 on the side of substrate 2 is emitted towards the lower side (observer side) of substrate 2 after passing through circuit element section 14 and substrate 2, while light emitted from functional layer 110 towards the opposite side of substrate 2 is reflected by cathode 12 and emitted towards the lower side (observer side) of substrate 2 after passing through circuit element section 14 and substrate 2.

The difference between the display apparatus of the present embodiment and the display apparatus of the first embodiment is that the luminescent layer is arranged between circuit element section 14 and bank section 112 of the substrate.

Thus, in the following explanation, the same reference symbols are used to represent those constituent elements shown in FIG. 21 that are the same as the constituent elements of the display apparatus of the first embodiment shown in FIG. 3, and their explanation is omitted.

Namely, although each of the constituent elements of circuit element section 14, pixel electrode 111, bank section 112 (inorganic bank layer 112a and organic bank layer 112b), functional layer 110 (positive hole injection/transport layer 110a and luminescent layer 110b) and cathode 12 are shown in FIG. 21, since these are the same as the constituent elements explained in the first embodiment, their explanation is omitted.

Luminescent element section 211 shown in FIG. 21 is mainly composed of functional layer 110 laminated on each of a plurality of pixel electrodes 111, bank section 112 provided between each pixel electrode 111 and functional layer 110 which separates each functional layer 110, and light blocking layer 213.

This light blocking layer 213 is arranged between second interlayer insulating film 144b and pixel electrode 111 of circuit element section 14 and inorganic bank layer 112a.

This light blocking layer 213 employs a single layer structure of a black resin layer comprised by mixing a black pigment such as carbon black into an acrylic resin or polyimide resin.

In addition, light blocking opening 213c is provided in light blocking layer 213 at a location corresponding to functional layer 110. In this manner, light blocking layer 213 is arranged between corresponding functional layers 110, and is located in the region where functional layer 110 is not formed (non-formed region).

Similar to light blocking layer 113 of the first embodiment, this light blocking layer 213 blocks light that has been emitted from luminescent layer 110b and reflected by cathode 12, and improves the legibility of the display apparatus by preventing the emission of reflected light from locations other than pixel region A. In addition, this light blocking layer 213 also improves the legibility of the display apparatus by suppressing the reflection of external light by cathode 12.

As a result of providing this light blocking layer 213, incoming light from a location other than the non-formed region of functional layer 110 as well as outgoing light from functional layer 110 can be blocked at the non-formed region of functional layer 110, thereby making it possible improve legibility by enhancing the contrast ratio of the display apparatus.

In particular, as a result of blocking light from functional layer 110 at the non-formed region of functional layer 110, mixed colored light caused by corresponding colored light that occurred in display apparatuses of the prior art can be blocked, thereby making it possible to enhance the contrast ratio of the display apparatus.

Furthermore, light blocking layer 213 is not limited to a single layer structure comprised of a black resin layer, but rather may also employ a laminated structure in which a metallic chromium (Cr) film and chromium oxide ($Cr_2O_5$) film are sequentially laminated on first interlayer insulating film 144b. In this case, the thickness of the metallic chromium film should be about 100 nm, while the thickness of the chromium oxide film should be about 50 nm.

Furthermore, the manufacturing method of the display apparatus of the present embodiment is nearly the same as the manufacturing method of the display apparatus of the first embodiment, with the exception that light blocking layer 213 and inorganic bank layer 112a are sequentially laminated on second interlayer insulating film 144b and pixel electrode 111, and that lower opening 112c and light blocking opening 213a are provided by etching and so forth, and organic bank layer 112b is laminated on inorganic bank layer 112a. Thus, with the exception of the above differences, the display apparatus of the present embodiment is manufactured using a similar procedure to the display apparatus of the first embodiment.

[Third Embodiment]

The following provides an explanation of a third embodiment of the present invention with reference to the drawings.

Figure 22:
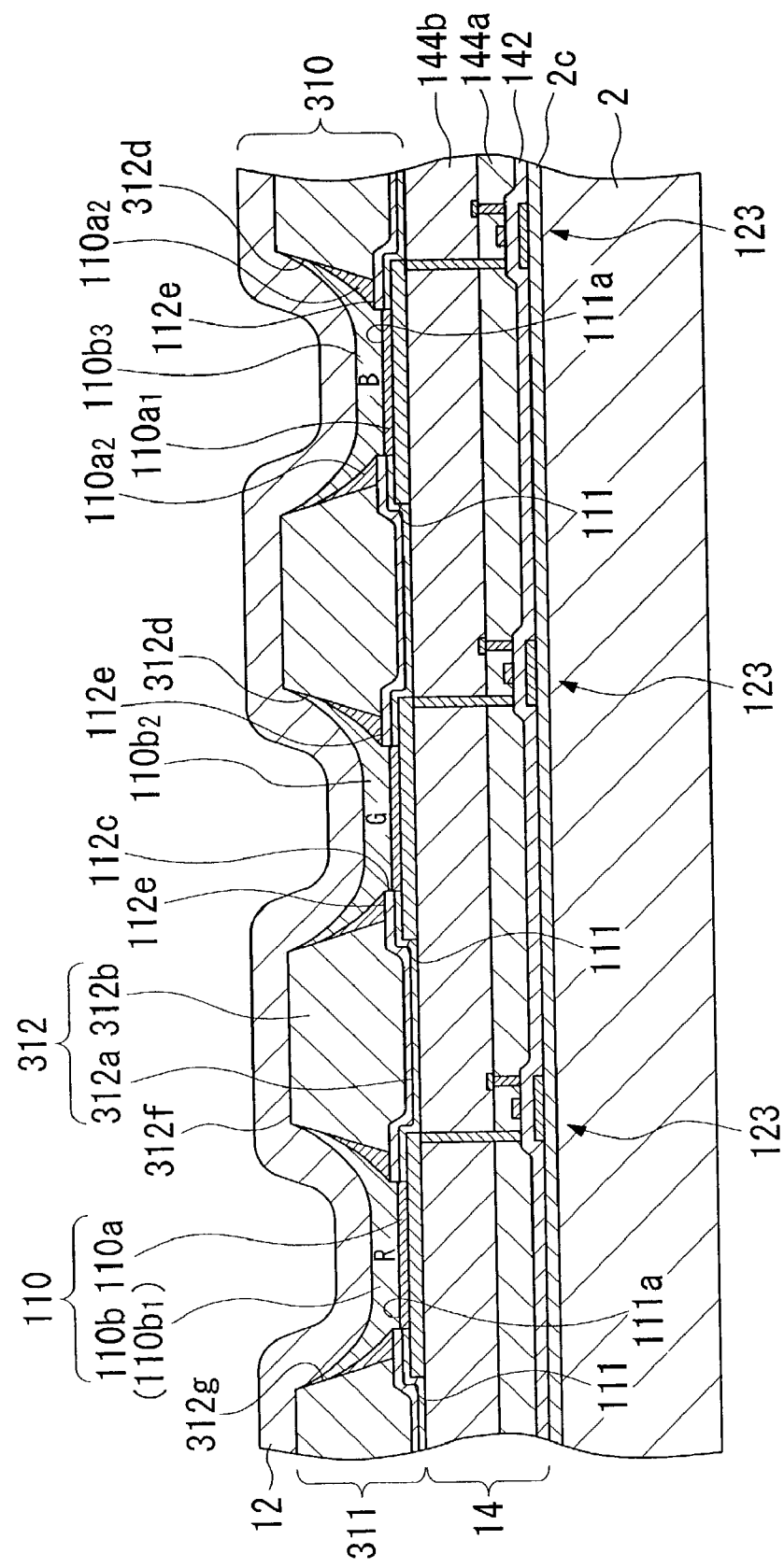
FIG. 22 is a drawing showing the essential portion of a display apparatus of a third embodiment of the present invention.

FIG. 22 is a cross-sectional view showing the essential portion of a display apparatus of the third embodiment.

As shown in FIG. 22, the display apparatus of the present embodiment is composed by sequentially laminating a circuit element section 14 in which TFT and other circuits are formed, luminescent element section 311 in which a luminescent layer is formed, and cathode 12 on a substrate 2.

In the display apparatus as claimed in the present embodiment, similar to the cases of the first and second embodiments, light emitted from functional layer 110 on the side of substrate 2 is emitted towards the lower side (observer side) of substrate 2 after passing through circuit element section 14 and substrate 2, while light emitted from functional layer 110 towards the opposite side of substrate 2 is reflected by cathode 12 and emitted towards the lower side (observer side) of substrate 2 after passing through circuit element section 14 and substrate 2.

The difference between the display apparatus of the present embodiment and the display apparatus of the first embodiment is that the organic bank layer serves as the light blocking layer by forming the organic bank layer with a black resin.

Thus, in the following explanation, the same reference symbols are used to represent those constituent elements shown in FIG. 22 that are the same as the constituent elements of the display apparatus of the first embodiment shown in FIG. 3, and their explanation is omitted.

Namely, although each of the constituent elements of circuit element section 14, pixel electrode 111, inorganic bank layer 112a, functional layer 110 (positive hole injection/transport layer 110a and luminescent layer 110b) and cathode 12 are shown in FIG. 22, since these are the same as the constituent elements explained in the first embodiment, their explanation is omitted.

Luminescent element section 311 shown in FIG. 22 is mainly composed of functional layer 110 laminated on each of a plurality of pixel electrodes 111, and bank section 312 provided between each pixel electrode 111 and functional layer 110 which separates each functional layer 110.

As shown in FIG. 22, bank section 312 is composed by laminating inorganic bank layer 312a located on the side of substrate 2 and organic bank section 312b located away from substrate 2.

Inorganic and organic bank layers 312a and 312b are formed so as to ride up onto the peripheral edge section of pixel electrode 111. In terms of the horizontal plane, the structure is such that the periphery of pixel electrode 111 and inorganic bank layer 312a are arranged so as to be overlapping in the horizontal plane. In addition, organic bank layer 312b is similarly arranged so as to overlap a portion of pixel electrode 111 in the horizontal plane. In addition, inorganic bank layer 312a is formed further towards the center of pixel electrode 111 than organic bank layer 312b. As a result of each first laminated section 112e of inorganic bank layer 312a being formed on the inside of pixel electrode 111 in this manner, lower opening 112c is provided corresponding to the formed location of pixel electrode 111.

In addition, upper opening 312d is formed in organic bank layer 312b. As shown in FIG. 22, upper opening 312d is formed to be wider than lower opening 112c and narrower than pixel electrode 111.

In addition, opening 312g that passes through inorganic bank layer 112c and organic bank layer 312d is then formed by connecting lower opening 112c and upper opening 312b in bank section 312.

Organic bank layer 312b also serves as a light blocking layer, and is formed from a black resin by mixing a black pigment such as carbon black into an ordinary resist such as polyimide resin. The thickness of this organic bank layer 312 is preferably within the range of 0.1–3.5 $\mu$m, and particularly preferably about 2 $\mu$m. If the thickness is less than 0.1 $\mu$m, organic bank layer 312b becomes thinner than the total thickness of the positive hole injection/transport layer and the luminescent layer to be described later, which is not preferable since it results in the risk of the luminescent layer overflowing from upper opening 112d, as well as the risk of a decrease in light blocking properties due to reduced thickness of the organic bank layer 312b also serving as the light blocking layer. In addition, if the thickness exceeds 3.5 $\mu$m, the level difference caused by upper opening 312d becomes excessively large, which is not preferable since step coverage of cathode 12 and reflective layer 13 formed on organic bank layer 312b can no longer be ensured. In addition, if the thickness of organic bank layer 312b is made to be 2 $\mu$m or more, insulation with driving thin film transistor 123 can be improved, thereby making this desirable.

In addition, the regions that exhibit liquid repellence are the wall surface of upper opening 312d and the upper surface 312f of organic bank layer 312b, and the surfaces of these regions are introduced with liquid repellent groups such as fluorine by plasma treatment using methane tetrafluoride for the treatment gas.

Furthermore, with the exception of the material of organic bank layer 312b as claimed in the present embodiment being composed of a black resin, it is equivalent to organic bank layer 112b as claimed in the first embodiment, and the positional relationship among this organic bank layer 312b, luminescent element 110 and cathode 12 is the same as the case of the first embodiment.

According to the display apparatus as described above, since organic bank layer 312b also serves as a light blocking layer, incoming light from the outside in a non-formed region of functional layer 110 as well as outgoing light from functional layer 110 can be blocked by this organic bank layer 312b, thereby making it possible to improve legibility by enhancing the contrast ratio of the display apparatus.

In addition, since organic bank layer 312b also serves as a light blocking layer, it is no longer necessary to separately provide a light blocking layer, thereby making it possible to simplify the constitution of the display apparatus.

Furthermore, the manufacturing method of the display apparatus of the present embodiment is nearly the same as the manufacturing method of the display apparatus of the first embodiment, with the exception that organic bank layer 312b is formed with a black resin, and that the light blocking layer formed between the organic bank layer and inorganic bank layer is omitted. Thus, with the exception of the above differences, the display apparatus of the present embodiment is manufactured using a similar procedure to the display apparatus of the first embodiment.

[Fourth Embodiment]

The following provides an explanation of a fourth embodiment of the present invention with reference to the drawings.

Figure 23:
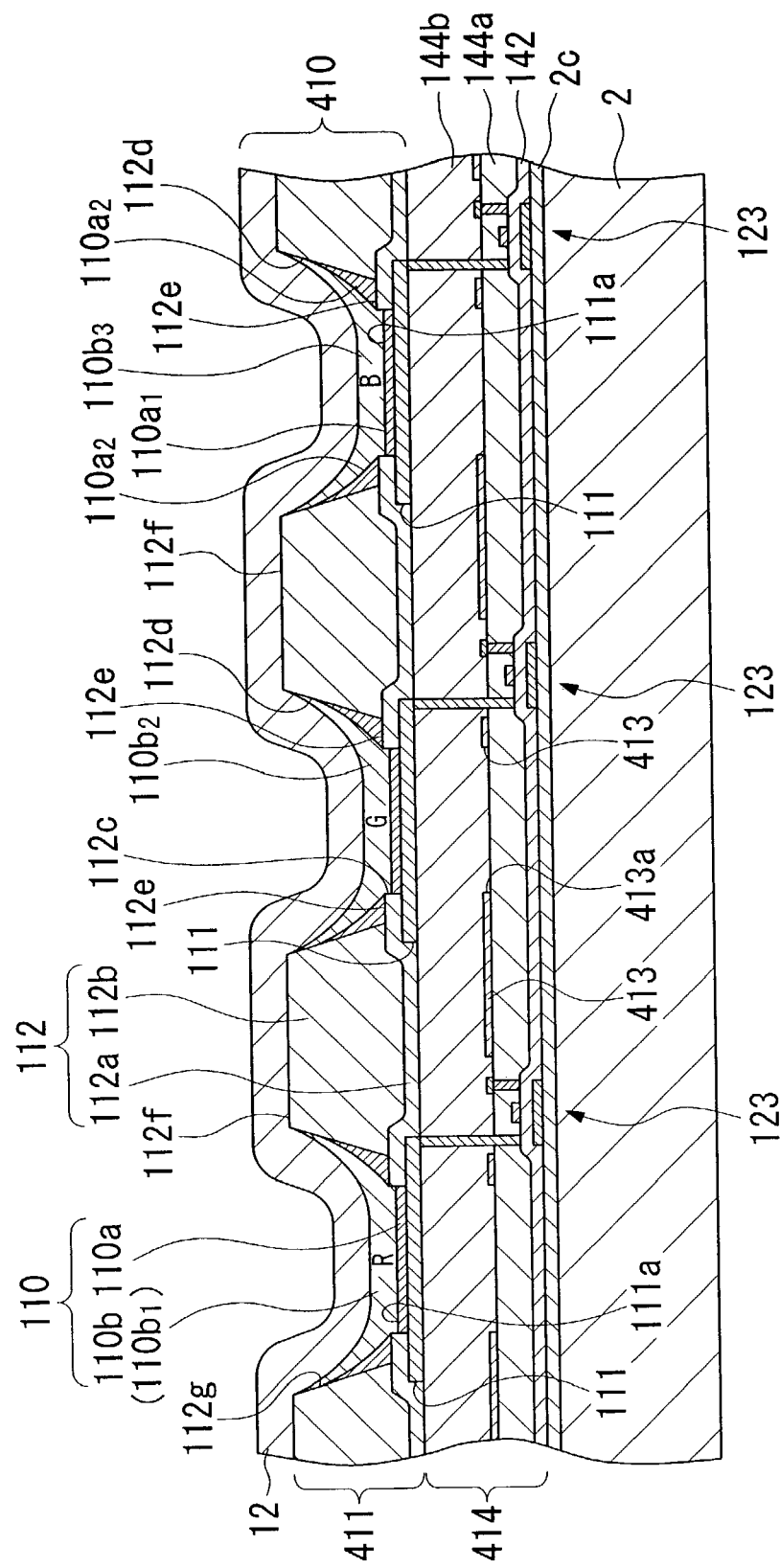
FIG. 23 is a drawing showing the essential portion of a display apparatus of a fourth embodiment of the present invention.

FIG. 23 is a cross-sectional view showing the essential portion of a display apparatus of the fourth embodiment.

As shown in FIG. 23, the display apparatus of the present embodiment is composed by sequentially laminating a circuit element section 414 in which TFT and other circuits are formed, luminescent element section 411 in which a luminescent layer is formed, and cathode 12 on a substrate 2.

In the display apparatus as claimed in the present embodiment, similar to the case of the first embodiment, light emitted from functional layer 110 of light emitting element section 411 on the side of substrate 2 is emitted towards the lower side (observer side) of substrate 2 after passing through circuit element section 414 and substrate 2, while light emitted from functional layer 110 towards the opposite side of substrate 2 is reflected by cathode 12 and emitted towards the lower side (observer side) of substrate 2 after passing through circuit element section 414 and substrate 2.

The difference between the display apparatus of the present embodiment and the display apparatus of the first embodiment is that the light blocking layer is arranged within circuit element section 414.

Thus, in the following explanation, the same reference symbols are used to represent those constituent elements shown in FIG. 23 that are the same as the constituent elements of the display apparatus of the first embodiment shown in FIG. 3, and their explanation is omitted.

Namely, although each of the constituent elements of pixel electrode 111, bank section 112 (inorganic bank layer 112a and organic bank layer 112b), functional layer 110 (positive hole injection/transport layer 110a and luminescent layer 110b) and cathode 12 are shown in FIG. 23, since these are the same as the constituent elements explained in the first embodiment, their explanation is omitted.

Luminescent element section 411 shown in FIG. 23 is mainly composed of functional layer 110 laminated on each of a plurality of pixel electrodes 111, and bank section 112 provided between each pixel electrode 111 and functional layer 110 which separates each functional layer 110. Luminescent element section 414 of the present embodiment is nearly equivalent to luminescent element section 11 as claimed in the first embodiment with the exception of having removed light blocking layer 113 from luminescent element section 11 of the first embodiment.

Next, an undercoating protective film 2c composed of a silicon oxide film is formed on substrate 2 in circuit element section 414, and an island-shaped semiconductor film 141 composed of polycrystalline silicon is formed on this undercoating protective film 2c. Furthermore, a source region 141a and a drain region 141b are formed by highly concentrated P ion implantation in semiconductor film 141. Furthermore, the section at which P is not introduced becomes channel region 141c.

Moreover, transparent gate insulating film 142 that covers undercoating protective film 2c and semiconductor film 141 is formed on circuit element section 414, a gate electrode 143 composed of Al, Mo, Ta, Ti or W and so forth is formed on gate insulating film 142, and a transparent first interlayer insulating film 144a and a second interlayer insulating film 144b are formed on gate electrode 143 and gate insulating film 142. Gate electrode 143 is provided at a location corresponding to channel region 141c of semiconductor film 141. In addition, light blocking layer 413 is formed between first interlayer insulating film 144a and second interlayer insulating film 144b.

In addition, contact holes 145 and 146 connected to source and drain regions 141a and 141b, respectively, of semiconductor film 141 are formed passing through first and second interlayer insulating films 144a and 144b.

A transparent pixel electrode 111 composed of ITO and so forth is patterned to a prescribed shape and formed on second interlayer insulating film 144b, and one contact hole 145 is connected to this pixel electrode 111.

Light blocking layer 413 employs a single layer structure of a black resin layer comprised by mixing a black pigment such as carbon black into an acrylic resin or polyimide resin.

Light blocking opening 413c is provided in light blocking layer 413 at a location corresponding to functional layer 110. In this manner, light blocking layer 413 is arranged between corresponding functional layers 110, and is located in a non-formed region of functional layer 110.

Similar to light blocking layer 113 of the first embodiment, this light blocking layer 413 blocks light that has been emitted from luminescent layer 110b and reflected by cathode 12, and improves the legibility of the display apparatus by preventing the emission of reflected light from locations other than pixel region A. In addition, this light blocking layer 413 also improves the legibility of the display apparatus by suppressing the reflection of external light by cathode 12.

As a result of providing this light blocking layer 413 within circuit element section 414, incoming light from the outside at a non-formed region of functional layer 110 and outgoing light from luminescent element 110 can be blocked at a non-formed region of the same, thereby making it possible improve legibility by enhancing the contrast ratio of the display apparatus.

In particular, as a result of blocking light from functional layer 110 at the non-formed region of functional layer 110, color bleeding caused by corresponding colored light that occurred in display apparatuses of the prior art can be prevented, thereby making it possible to enhance the contrast ratio of the display apparatus.

Furthermore, the manufacturing method of the display apparatus of the present embodiment is nearly the same as the manufacturing method of the display apparatus of the first embodiment, with the exception that light blocking layer 413 is formed between second interlayer insulating film 144b and first interlayer insulating film 144a during formation of circuit element section 414, and that the light blocking layer formed between the organic bank layer and inorganic bank layer is omitted. Thus, with the exception of the above differences, the display apparatus of the present embodiment is manufactured using a similar procedure to the display apparatus of the first apparatus.

[Fifth Embodiment]

The following provides an explanation of a fifth embodiment of the present invention with reference to the drawings.

Figure 24:
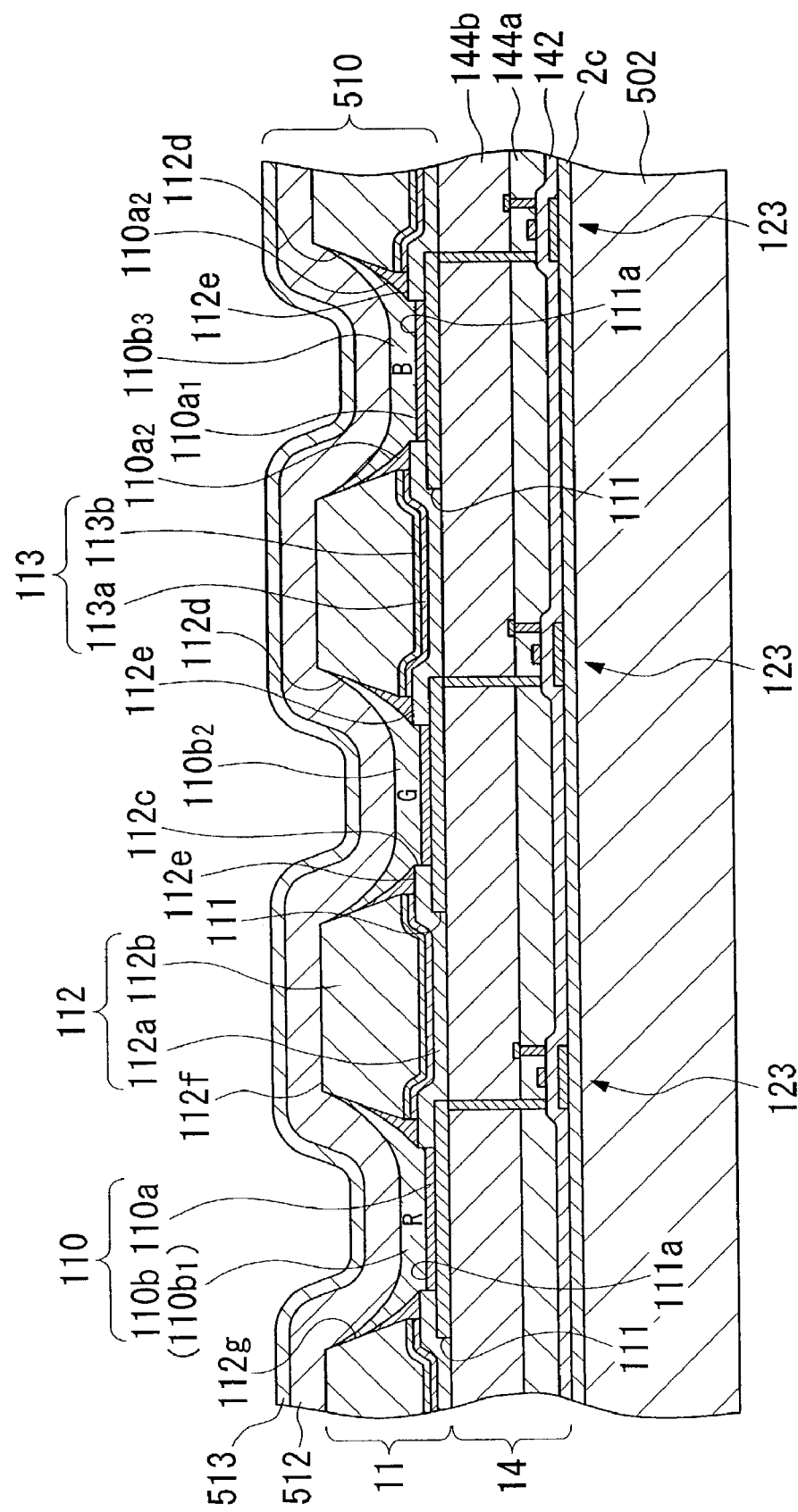
FIG. 24 is a drawing showing the essential portion of a display apparatus of a fifth embodiment of the present invention.

FIG. 24 is a cross-sectional view showing the essential portion of a display apparatus of the fifth embodiment.

As shown in FIG. 24, the display apparatus of the present embodiment is composed by being provided with a display element section 510 composed by sequentially laminating a luminescent element section 11, cathode 512 and protective layer 513 on a substrate 502 made of metal. In addition, circuit element section 14 is provided between luminescent element section 11 and substrate 502.

In the matrix type display element section 510 as claimed in the present embodiment, light emitted from functional layer 110 to the side of substrate 502 is reflected by metal substrate 502, and emitted towards the upper side (observer side) of substrate 2 after passing through cathode 512 and protective layer 513, while light emitted from functional layer 110 towards the opposite side of substrate 502 is emitted toward the upper side (observer side) of substrate 502 after continuing to pass through cathode 512 and protective layer 513. In this manner, in the display apparatus as claimed in the present embodiment, a constitution is employed in which light is made to be emitted towards the upper side of substrate 502, and the direction of that outgoing light is the opposite direction of the matrix type display elements of the first through fourth embodiments.

The difference between the display apparatus of the present embodiment and the display apparatus of the first embodiment is that protective layer 513 is formed instead of the reflective layer, and cathode 512 is formed to be thin.

Thus, in the following explanation, the same reference symbols are used to represent those constituent elements shown in FIG. 24 that are the same as the constituent elements of the display apparatus of the first embodiment shown in FIG. 3, and their explanation is omitted.

Namely, although each of the constituent elements of circuit element section 14, pixel electrode 111, bank section 112 (inorganic bank layer 112a and organic bank layer 112b), functional layer 110 (positive hole injection/transport layer 110a and luminescent layer 110b) and light blocking layer 113 (first light blocking film 113a and second light blocking film 113b) are shown in FIG. 24, since these are the same as the constituent elements explained in the first embodiment, their explanation is omitted.

Display element section 510 shown in FIG. 24 is formed by sequentially laminating luminescent element section 11, cathode 512 and protective layer 513 on metal substrate 502.

Substrate 2 is a metal substrate made of, for example, Al, and reflects light emitted from functional layer 110 so as to be able to emit that light towards the upper side of substrate 502.

In addition, cathode 512 is formed over the entire surface of luminescent element section 11, and forms a pair with pixel electrode 111 to fulfill the role of injecting current to functional layer 110. This cathode 512 is composed, for example, by laminating a calcium layer and an aluminum layer. At this time, it is preferable to provide a cathode having a low work function on the side close to the luminescent layer, and in this embodiment in particular, cathode 12 fulfills the role of injecting electrons into luminescent layer 110b by being in direct contact with luminescent layer 110b. In addition, since lithium fluoride causes light to be emitted efficiently depending on the material of the luminescent layer, there are also cases in which LiF is formed between luminescent layer 110 and cathode 512.

Furthermore, red and green luminescent layers 110b1 and 110b2 are not limited to the use of lithium fluoride, but rather other materials may also be used. Thus, in this case, a layer composed of lithium fluoride may be formed only for blue (B) luminescent layer 110b3, while a material other than lithium fluoride may be laminated onto the other red and green luminescent layers 110b1 and 110b2. In addition, only calcium may be formed on red and green luminescent layers 110b1 and 110b2 without forming lithium fluoride.

In addition, cathode 512 of the present embodiment is formed to be thinner than cathode 12 of the first through fourth embodiments, and is made to allow light to pass through it that has been emitted from functional layer 110.

Next, protective layer 513 is formed on cathode 512, and prevents oxidation of cathode 512 or luminescent layer 110b formed within luminescent element section 11 by preventing the infiltration of water or oxygen into cathode 512 and luminescent element section 11.

This protective layer 513 is preferably composed of, for example, an Ag film.

Protective layer 513 of the present embodiment is formed to be comparatively thin, and is made to allow light to pass through it emitted from luminescent element 110.

According to the above display apparatus, since light emitted from functional layer 110 is emitted after passing through cathode 512 and protective layer 513, the amount of light lost can be reduced as compared with the case of light passing through the substrate and circuit element section, thereby making it possible to increase the luminance of the display apparatus.

[Sixth Embodiment]

The following provides an explanation of a sixth embodiment of the present invention with reference to the drawings. Furthermore, in the following explanation, the same reference symbols are used to represent those constituent elements that are the same as the constituent elements shown in FIG. 3, and their explanation is partially omitted.

Figure 25:
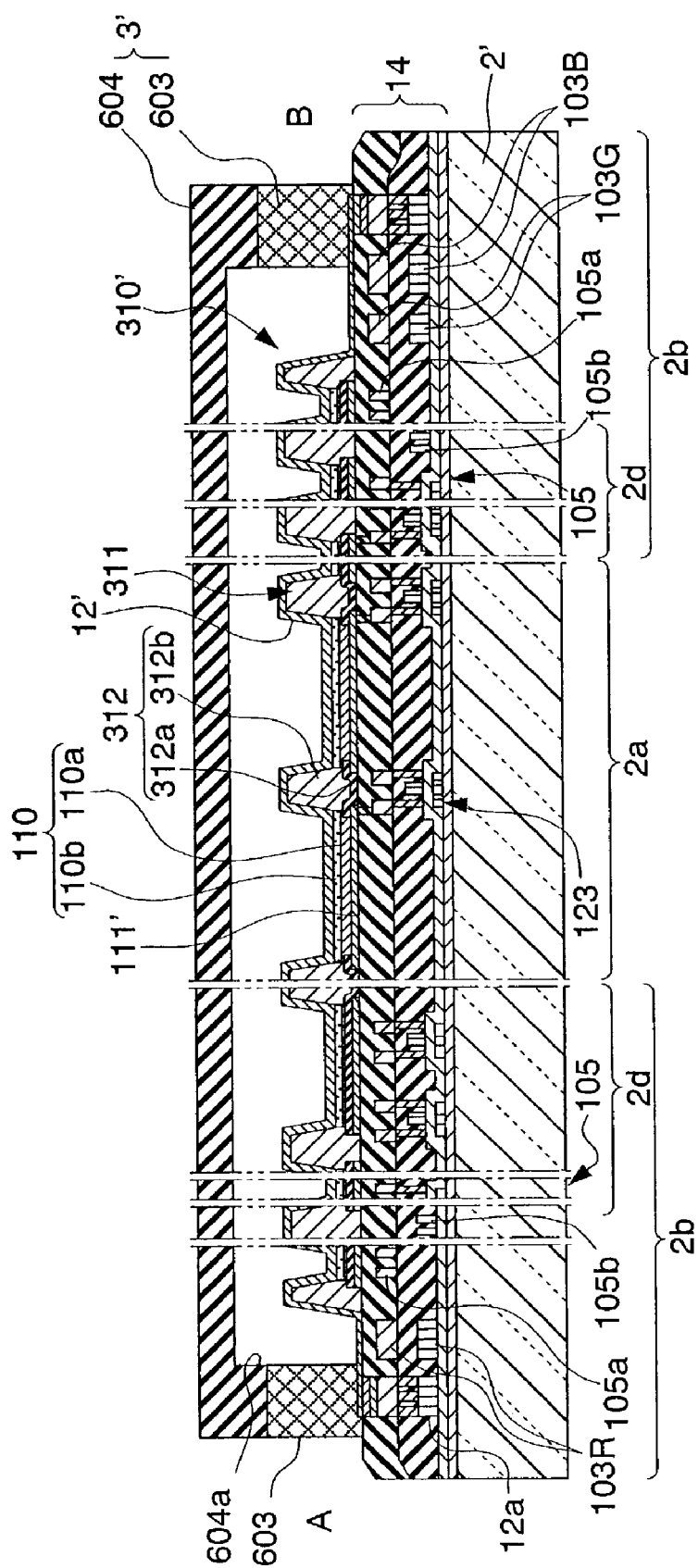
FIG. 25 is a cross-sectional view showing a display apparatus of a sixth embodiment of the present invention that corresponds to FIG. 2B.

FIG. 25 is a cross-sectional view showing a display apparatus of the sixth embodiment.

As shown in FIG. 25, the display apparatus of the present embodiment is provided with substrate 2', luminescent element section 311 provided with luminescent elements arranged in the form of a matrix and formed on substrate 2', and cathode 12' formed on luminescent element section 311. Display element 310' is composed by luminescent element section 311 and cathode 12'.

The display apparatus of the present embodiment has a so-called top emission structure in which the side of sealing section 3' is composed as the display surface, and a transparent substrate (or semi-transparent substrate) and opaque substrate may be used for substrate 2'. Examples of transparent or semi-transparent substrates include those made of glass, quartz or resin (plastic or plastic film), and inexpensive soda glass is used particularly preferably. Examples of opaque substrates include those in which surface oxidation or other insulation treatment is performed on ceramics such as alumina or a metal sheet such as stainless steel, as well as thermosetting resins and thermoplastic resins. In addition, substrate 2' is divided into a display region 2a located in the center, and a non-display region 2b that surrounds display region 2a positioned around the peripheral edge of substrate 2'.

Display region 2a is a region formed by luminescent elements arranged in the form of a matrix, and non-display region 2b is formed outside this display region. Dummy display region 2d adjacent to display region 2a is formed in this non-display region 2b.

In addition, circuit element section 14 is provided between luminescent element section 311 and substrate 2', and similar to the above first embodiment, this circuit element section 14 is provided with scanning lines, signal lines, holding capacitor, switching thin film transistor and driving thin film transistor 123 and so forth.

In addition, one end of cathode 12' is connected from luminescent element section 311 to cathode wiring 12a formed on substrate 2', and one end of this wiring is connected to wiring on a flexible substrate (not shown). In addition, this wiring is connected to a drive IC (drive circuit) not shown provided on the flexible substrate.

In addition, power lines 103 (103R, 103G, 103B) explained in the previously described first embodiment are wired to non-display region 2b of circuit element section 14.

In addition, the above-mentioned scanning side drive circuits 105 are arranged on both sides of display region 2a. These scanning side drive circuits 105 are provided within circuit element section 14 on the lower side of dummy region 2d. Moreover, drive circuit control signal wiring 105a and drive circuit power supply wiring 105b connected to scanning side drive circuits 105 are provided within circuit element section 14.

In addition, sealing section 3' is provided on luminescent element section 311. This sealing section 3' is composed of sealing resin 603 coated onto substrate 2' and sealing can 604'. Sealing resin 603 is made of a thermosetting resin or ultraviolet setting resin, and an epoxy resin that is a type of thermosetting resin is particularly preferable.

This sealing resin 603 is coated in the shape of a ring around substrate 2', and is coated by, for example, a microdispenser. This sealing resin 603 joins substrate 2' and sealing can 604', and prevents oxidation of cathode 12' or a luminescent layer not shown in the drawing that is formed in luminescent element section 311 by preventing the infiltration of water or oxygen into sealing can 604' from between substrate 2' and sealing can 604'.

Sealing can 604' is made of a light transmitting member such as glass or resin, is joined to substrate 2' via sealing resin 603, and indentation 604a that houses display elements 310' is provided inside. Furthermore, a getter that absorbs water, oxygen and so forth may be provided as necessary in indentation 604a. This getter may also be made to not have an effect on the display by providing, for example, in non-display region 2b within indentation 604a.

Figure 26:
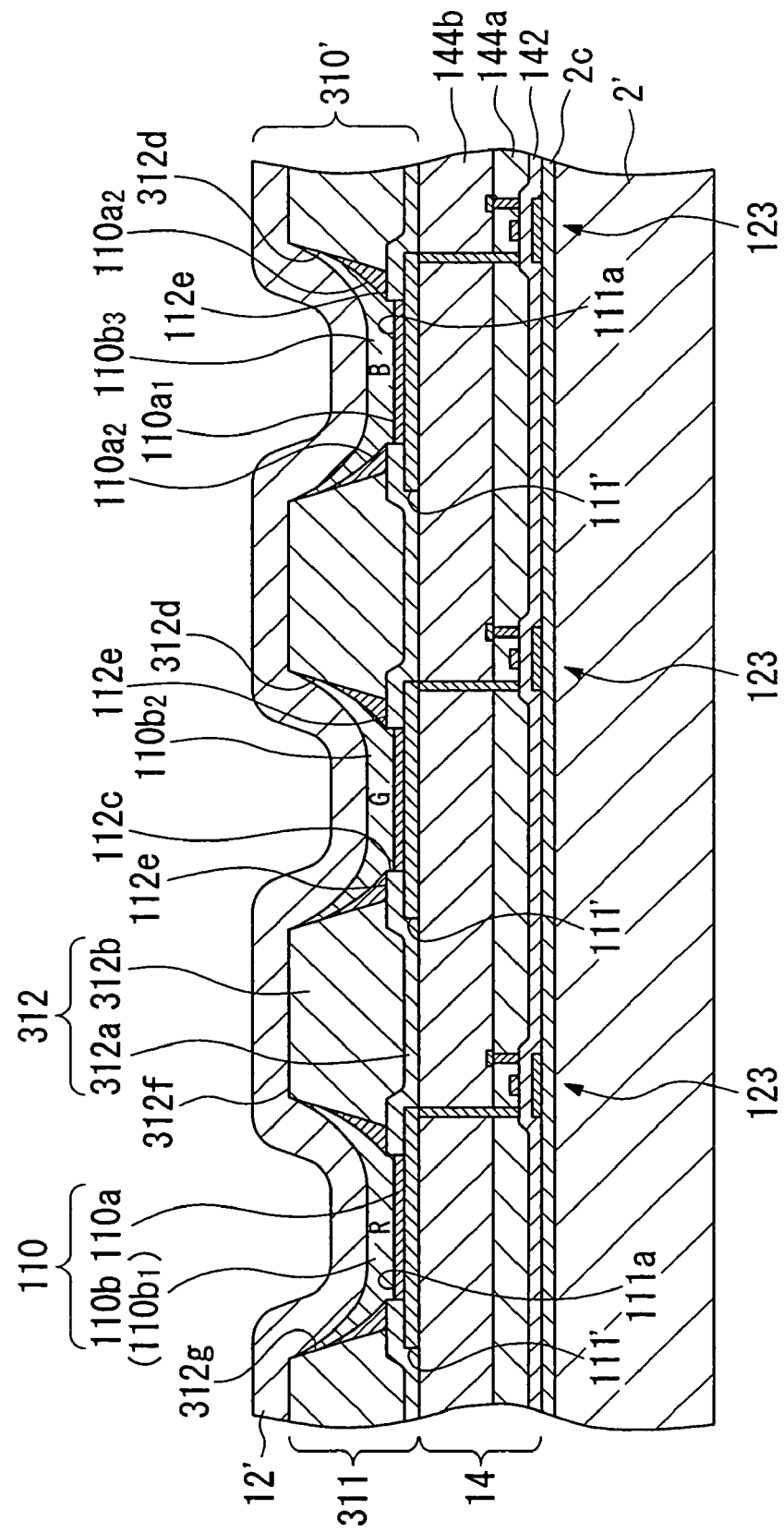
FIG. 26 is a drawing showing the essential portion of a display apparatus of a sixth embodiment of the present invention that corresponds to FIG. 3.

FIG. 26 shows an enlarged view of the cross-sectional structure of a display region in this display apparatus. Three pixel regions are shown in this FIG. 26. This display apparatus is composed by sequentially laminating circuit element section 14, in which TFT and other circuits are formed, luminescent element section 311 in which functional layer 110 is formed, and cathode 12 on substrate 2'.

In this display apparatus, together with light emitted from functional layer 110 towards the side of sealing section 3' being emitted towards the upper side (observer side) of sealing can 604', light emitted from functional layer 110 towards the side of substrate 2' is reflected by pixel electrode 111' and emitted towards the side of sealing section 3' (observer side). Consequently, a transparent material such as ITO, Pt, Ir, Ni or Pd is used for cathode 12'. It is preferable to use a thick film having a film thickness of about 75 nm, and a thinner film is more preferable. In addition, a highly reflective metallic material such as Al or Ag is preferably used for pixel electrode 111', and as a result, light emitted towards the side of substrate 2' can be efficiently emitted towards the side of sealing section 3'.

Luminescent element section 311 is mainly composed of functional layer 110 laminated on each of a plurality of pixel electrodes 111', and bank section 312 provided between each pixel electrode 111' and functional layer 110 which separates each functional layer 110. Cathode 12' is arranged on functional layer 110. A luminescent element is composed by pixel electrode 111', functional layer 110 and cathode 12'. Here, pixel electrode 111' is formed by, for example, ITO, and is formed by patterning into a roughly rectangular shape when viewed overhead. The thickness of this pixel electrode 111' is preferably within the range of, for example, 50–200 nm, and particularly preferably about 150 nm. Bank section 312 is provided between each pixel electrode 111'.

Bank section 312 is composed by laminating inorganic bank layer 312a located on the side of substrate 2 (first bank layer), and organic bank layer 312b located away from substrate 2 (second bank layer).

Inorganic bank layer 312a and 312b are formed so as to ride up onto the peripheral edge of pixel electrode 111'. In terms of the horizontal plane, the structure is such that the peripheral edge of pixel electrode 111' and inorganic bank layer 312a are arranged so as to be overlapping in the horizontal plane. In addition, organic bank layer 312b is similarly arranged so as to overlap a portion of pixel electrode 111' in the horizontal plane. In addition, inorganic bank layer 312a is formed further towards the center of pixel electrode 111' than organic bank layer 312b. As a result of each first laminated section 112e of inorganic bank layer 312a being formed on the inside of pixel electrode 111' in this manner, lower opening 112c is provided corresponding to the formed location of pixel electrode 111'.

In addition, upper opening 312d is formed in organic bank layer 312b. This upper opening 312d is provided at the formed location of pixel electrode 111' and so as to correspond to lower opening 112c. Upper opening 312d is formed to be wider than lower opening 112c and narrower than pixel electrode 111'. In addition, it may also be formed so that the location of the upper portion of upper opening 312d is nearly at the same location as the edge of pixel electrode 111'. In this case, as shown in FIG. 26, the cross-section of upper opening 312d of organic bank layer 312b has an inclined shape.

Opening 312g that passes through inorganic bank layer 312a and organic bank layer 312b is then formed by connecting lower opening 112c and upper opening 312d in bank section 312.

Organic bank layer 312b also serves as a light blocking layer, is formed from a black resin composed by mixing a black pigment such as carbon black into an ordinary resist such as acrylic resin or polyimide resin. The thickness of this organic bank layer 312b is preferably within the range of 0.1–3.5 $\mu$m, and particularly preferably about 2 $\mu$m. If the thickness is less than 0.1 $\mu$m, organic bank layer 312b becomes thinner than the total thickness of the positive hole injection/transport layer and the luminescent layer to be described later, which is not preferable since it results in the risk of the luminescent layer overflowing from upper opening 312d, as well as the risk of a decrease in light blocking properties due to reduced thickness of the organic bank layer 312b also serving as the light blocking layer. In addition, if the thickness exceeds 3.5 $\mu$m, the level difference caused by upper opening 312d becomes excessively large, which is not preferable since step coverage of cathode 12 and reflective layer 13 formed on organic bank layer 312b can no longer be ensured. In addition, if the thickness of organic bank layer 312b is made to be 2 $\mu$m or more, insulation with driving thin film transistor 123 can be improved, thereby making this desirable.

In addition, inorganic bank layer 312a is preferably composed of an inorganic material such as SiO, $SiO_2$ or $TiO_2$. The film thickness of this inorganic bank layer 312a is preferably within the range of, for example, 50–200 nm, and is particularly preferably 150 nm. If the film thickness is less than 50 nm, inorganic bank layer 312a becomes thinner than a positive hole injection/transport layer to be described later, which is not preferable since it prevents the securing of flatness for the positive hole injection/transport layer. In addition, if the film thickness exceeds 200 nm, the level difference with lower opening 112c becomes large, which is not preferable since it prevents the securing of flatness of a luminescent layer to be described later that is laminated onto the positive hole injection/transport layer.

In addition, regions exhibiting lyophilic properties and regions exhibiting liquid repellence are formed on bank section 312.

The regions that exhibit lyophilic properties are first laminated section 112e of inorganic bank layer 312a and electrode surface 111a of pixel electrode 111', and these regions are surface-treated to be lyophilic by plasma treatment using oxygen for the treatment gas. In addition, the regions that exhibit liquid repellence are the wall surface of upper opening 312d and the upper surface 312f of organic bank layer 312b, and the surfaces of these regions are fluorine-treated (treated to be liquid repellent) by plasma treatment using methane tetrafluoride for the treatment gas.

Functional layer 110 is composed of positive hole injection/transplant layer 110a laminated on pixel electrode 111', and luminescent layer 110b formed on positive hole injection/transplant layer 110a adjacent to it. Furthermore, other functional layers having other functions may also be formed adjacent to luminescent layer 110b. For example, an electron transport layer can also be formed.

Together with having the function of injecting positive holes into luminescent layer 110b, positive hole injection/transport layer 110a also has the function of transporting positive holes within positive hole injection/transport layer 110a. By providing such a positive hole injection/transport layer 110a between pixel electrode 111' and luminescent layer 10b, the luminescent efficiency, lifetime and other element characteristics of luminescent layer 110b are improved. In addition, in luminescent layer 110b, positive holes injected from positive hole injection/transport layer 110a and electrons injected from cathode 12' are recoupled in the luminescent layer to emit light.

Positive hole injection/transport layer 110a is composed of flat section 110a1 located within lower opening 112c and formed on pixel electrode surface 111a, and peripheral edge section 110a2 located within upper opening 312d and formed on first laminated section 112e of the inorganic bank layer. In addition, depending on its structure, positive hole injection/transport layer 110a may be formed only on pixel electrode 111' and between it and inorganic bank layer 112a (lower opening 110c) (there is also a mode in which it is only formed in the previously mentioned flat section).

This flat section 110a1 is formed to have a nearly constant thickness within the range of, for example, 50–70 nm.

In the case peripheral edge section 110a2 is formed, together with being located on first laminated section 112e of the inorganic bank layer, it is in contact with the wall surface of upper opening 312d, namely organic bank layer 312b. In addition, the thickness of peripheral edge section 110a2 is thinner on the side close to electrode surface 111a, gradually increases along the direction moving away from electrode surface 111a, and is the thickest near the wall surface of lower opening 312d.

The reason for peripheral edge section 110a2 exhibiting the above shape is that, since positive hole injection/transport layer 110a is formed by discharging a first composition containing a positive hole injection/transport layer forming material and polar solvent (composition) into opening 312 and then removing the polar solvent, volatilization of the polar solvent occurs mainly on first laminated section 112e of inorganic bank layer 312a, and the positive hole injection/transport layer forming material is intensively concentrated and precipitated on this first laminated section 112e.

In addition, luminescent layer 110b is formed across flat section 110a1 and peripheral edge section 110a2 of positive hole injection/transport layer 110a, and its thickness on flat section 110a1 is made to be within the range of, for example, 50–80 nm.

Luminescent layer 110b has three types of luminescent layers consisting of red luminescent layer 110b1 that emits red light (R), green luminescent layer 110b2 that emits green light (G), and blue luminescent layer 110b3 that emits blue light (B), and each luminescent layer 110*b*1 through 110*b*3 is arranged in the form of stripes.

Furthermore, since the constitution of circuit element section 14 is the same as the previously mentioned first embodiment, its explanation is omitted.

Thus, similar to the previously mentioned third embodiment, since organic bank layer 312*b* also serves as a light blocking layer in the display apparatus of the present embodiment, incoming light from the outside in the region in which function layer 110 is not formed as well as outgoing light from functional layer 110 can be blocked by this organic bank layer 312*b*, thereby making it possible to improve legibility by enhancing the contrast ratio of the display apparatus. In addition, although a structure is shown in FIG. 25 in which TFT 123 is arranged on the side of the lower layer of bank section 112 (namely, in the region between adjacent luminescent layers), in the case light from luminescent layer 110*b* is extracted from the side of sealing section 3' as in the present embodiment, since the pixel numerical aperture is not affected by the circuit structure arranged on the side of the lower layer of pixel electrode 111', the wiring of circuit element section 14, TFT 123 and pixel electrode 111' may be arranged so as to be overlapping when viewed from overhead. As a result, a high-luminance and large-screen display can be realized by making pixel electrode 111' as wide as possible while also making the wiring thickness sufficiently large.

Furthermore, the manufacturing method of the display apparatus of the present embodiment is roughly similar to the manufacturing method of the display apparatus of the third embodiment, and only differs with respect to pixel electrodes 111', cathode 12' and the material of sealing can 604'. Thus, with the exception of the above differences, the display apparatus of the present embodiment is manufactured using a procedure similar to the manufacturing method of the third embodiment.

[Seventh Embodiment]

Next, an explanation is provided of specific examples of electric devices equipped with any of the display apparatuses of the first through sixth embodiments.

Figure 27A:
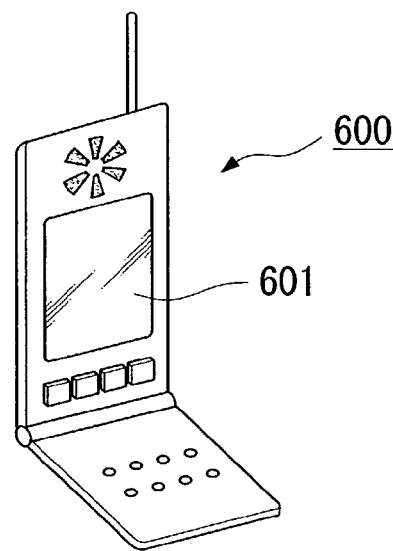
FIGS. 27A, 27B and 27C are perspective views showing an electric device that is a seventh embodiment of the present invention.

FIG. 27A is a perspective view showing an example of a cellular telephone. In FIG. 27A, reference symbol 600 indicates a cellular telephone body, while reference symbol 601 indicates a display unit that uses any of the previously mentioned display apparatuses.

Figure 27B:
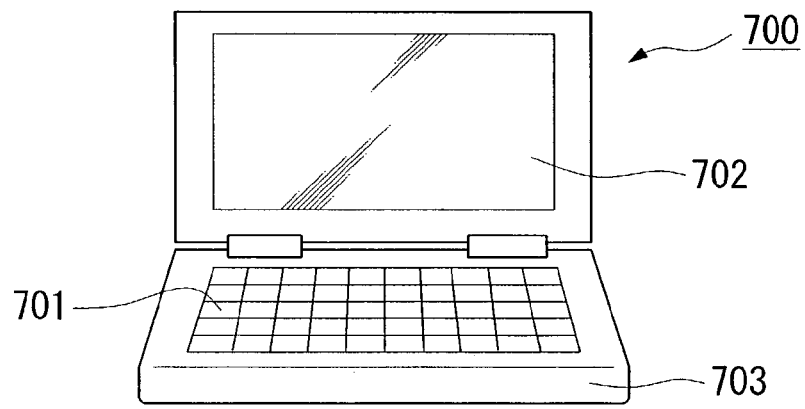

FIG. 27B is a perspective view showing an example of a portable information processing apparatus such as a word processor or personal computer. In FIG. 27B, reference symbol 700 indicates an information processing apparatus, reference symbol 701 indicates a keyboard or other input unit, reference symbol 703 indicates the information processing apparatus body, and reference symbol 702 indicates a display unit that uses any of the previously mentioned display apparatuses.

Figure 27C:
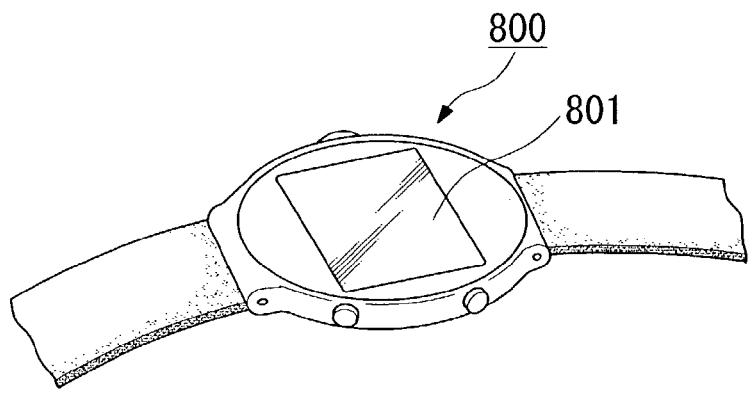

FIG. 27C is a perspective view showing an example of a wristwatch-type electric device. In FIG. 27C, reference symbol 800 indicates the watch body, while reference symbol 801 indicates a display unit that uses any of the previously mentioned display apparatuses.

Each of the electric devices shown in FIGS. 27A through 27C is provided with a display unit that uses any of the display apparatuses of the previously mentioned first through sixth embodiments, and since it has the characteristics of any of the display apparatuses of the previous first through sixth embodiments, is an electric device that offers the advantage of high luminance and superior display quality.

In manufacturing of these electric devices, similar to the first through sixth embodiments, a display apparatus 1 is composed that is provided with a drive IC 6*a* (drive circuit) like that shown in FIG. 2, and this display apparatus 1 is then manufactured by incorporating in a cellular telephone, portable information processing apparatus or wristwatch-type electric device.

Furthermore, the technical scope of the present invention is not limited to the previously mentioned embodiments, but rather various modifications may be added within a range that does deviate from the gist of the present invention.

Figure 28:
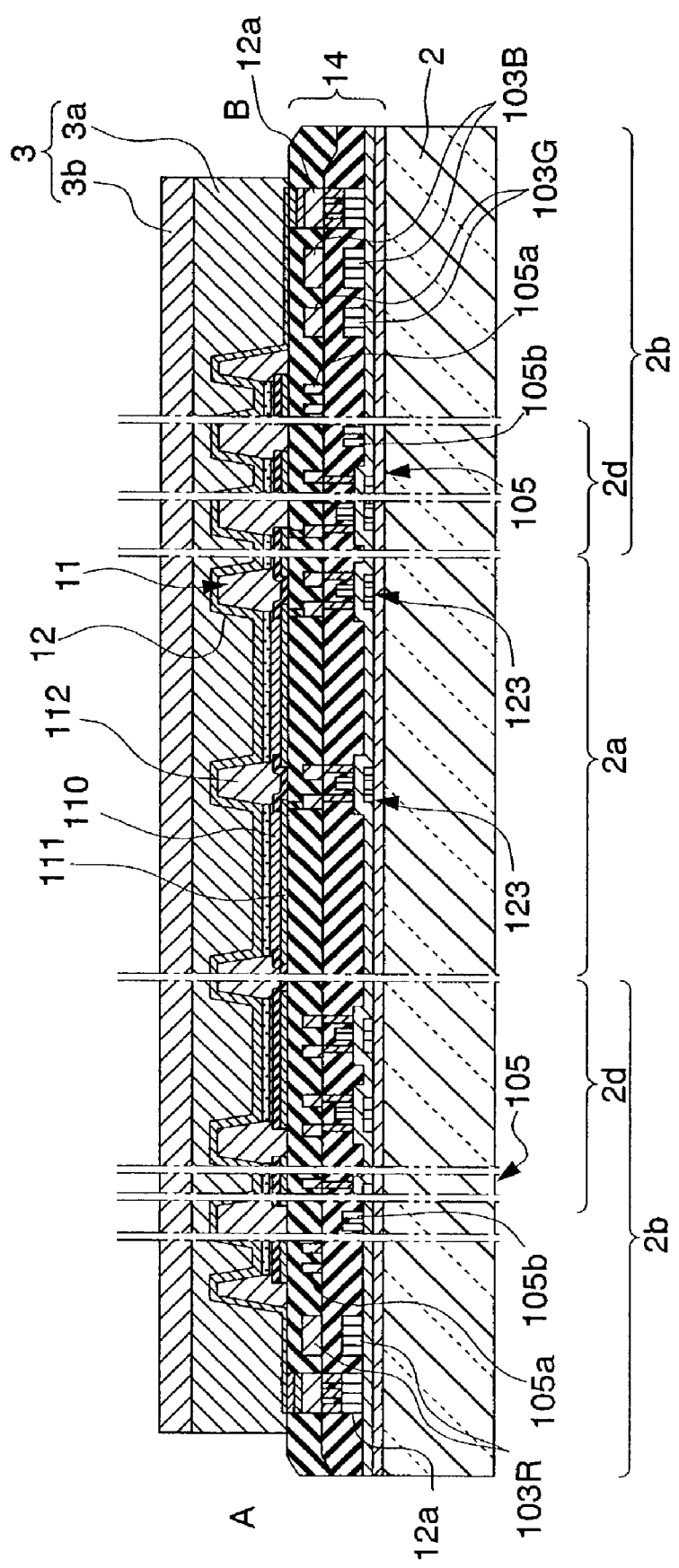
FIG. 28 is a cross-sectional schematic drawing showing another example of a display apparatus as claimed in the present invention.

FIG. 28 shows a cross-sectional schematic drawing showing another example of a display apparatus as claimed in the present invention. The display apparatus shown in FIG. 28 is composed by being provided with a substrate 2, display element 10 formed on substrate 2, sealing resin 603 coated in the shape of a ring around substrate 2, and sealing can 604 provided on display element 10.

Substrate 2 and display element 10 are the same as the substrate 2 and display element 10 as claimed in the first embodiment. Display element 10 is composed mainly by luminescent element section 11 and cathode 12 formed on said luminescent element section 11.

In addition, as shown in FIG. 28, sealing section 3 is provided on luminescent element section 11. This sealing section 3 is composed of sealing resin 3*a* made of a thermosetting resin or ultraviolet setting resin coated onto cathode 12, and sealing substrate 3*b* arranged on sealing resin 3*a*. Furthermore, preferable examples of sealing resin 3*a* are those that do not generate gas or solvent and so forth during setting.

This sealing section 3 is at least formed so as to nearly cover cathode 12 on luminescent element section 11, and prevents oxidation of a luminescent layer to be described later formed within cathode 12 or luminescent element section 11 by preventing infiltration of water or oxygen to cathode 12 and luminescent element section 11.

Furthermore, sealing substrate 3*b* protects sealing resin 3*a* by being coupled to sealing resin 3*a*, and is preferably a glass plate, metal plate or resin plate.

Figure 29:
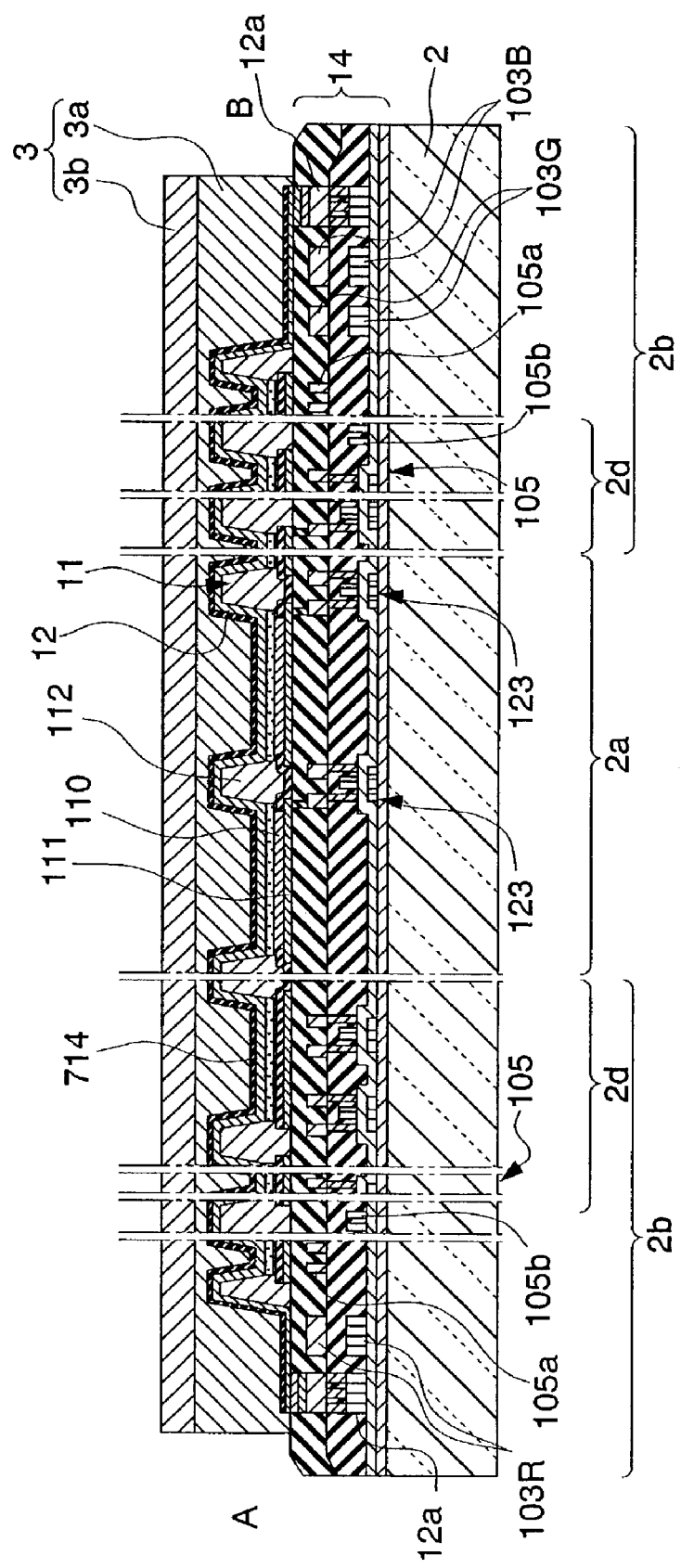
FIG. 29 is a cross-sectional schematic drawing showing a different example of a display apparatus as claimed in the present invention.

In addition, FIG. 29 shows a cross-sectional schematic drawing of another example of a display apparatus as claimed in the present invention. The display apparatus shown in FIG. 29 is composed by being provided with a substrate 2, display element 10 formed on substrate 2, sealing resin 3*a* coated over the entire surface of the display elements 10, and sealing substrate 3*b* provided on sealing resin 3*a*.

Substrate 2, display element 10, sealing resin 3*a* and sealing substrate 3*b* are the same as the substrate 2, display element 10, sealing material 3 and sealing substrate 4 as claimed in the first embodiment. Display 10 is mainly composed of luminescent element section 11 and cathode 12 formed on said luminescent element section 11.

In addition, as shown in FIG. 29, protective layer 714 is formed between sealing material 3 and cathode 12. Protective layer 714 is made of $SiO_2$, SiN and so forth, and has a thickness within the range of 100–200 nm. This protective layer 714 prevents oxidation of a luminescent layer not shown in the drawing formed within cathode 12 or luminescent element section 11 by preventing infiltration of water or oxygen to cathode 12 and luminescent element section 11.

According to the above display apparatus, since the infiltration of water and oxygen is effectively prevented to prevent oxidation of cathode 12 or luminescent element section 11, a display apparatus can be achieved that has high luminance and a long lifetime.

Figure 30A:
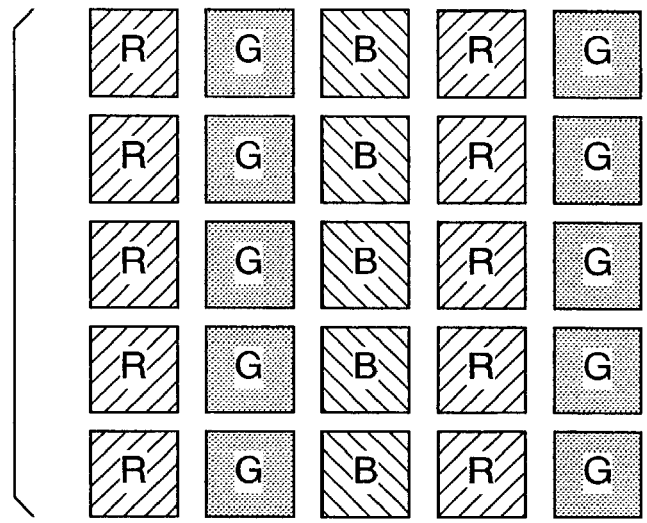
FIGS. 30A through 30C are overhead schematic drawings showing layouts of luminescent layers, with FIG. 30A indicating a striped layout, FIG. 30B a mosaic layout, and FIG. 30C a delta layout.
Figure 30B:
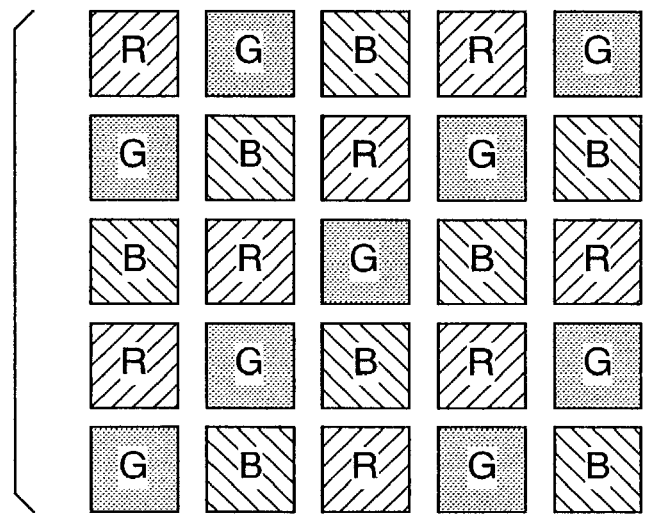
Figure 30C:
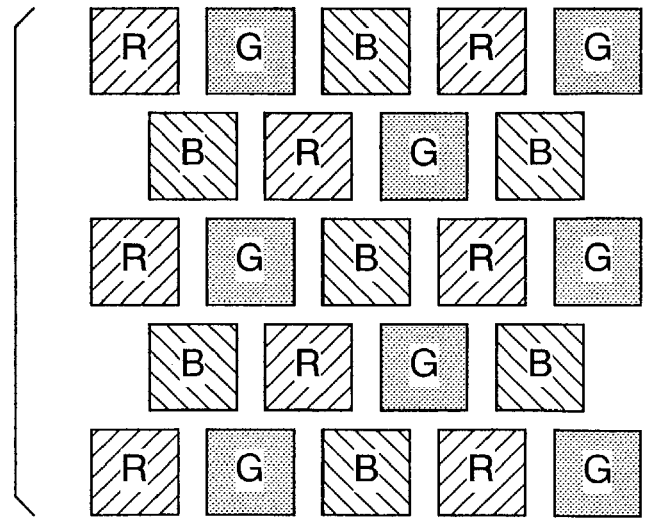
Figure 31:
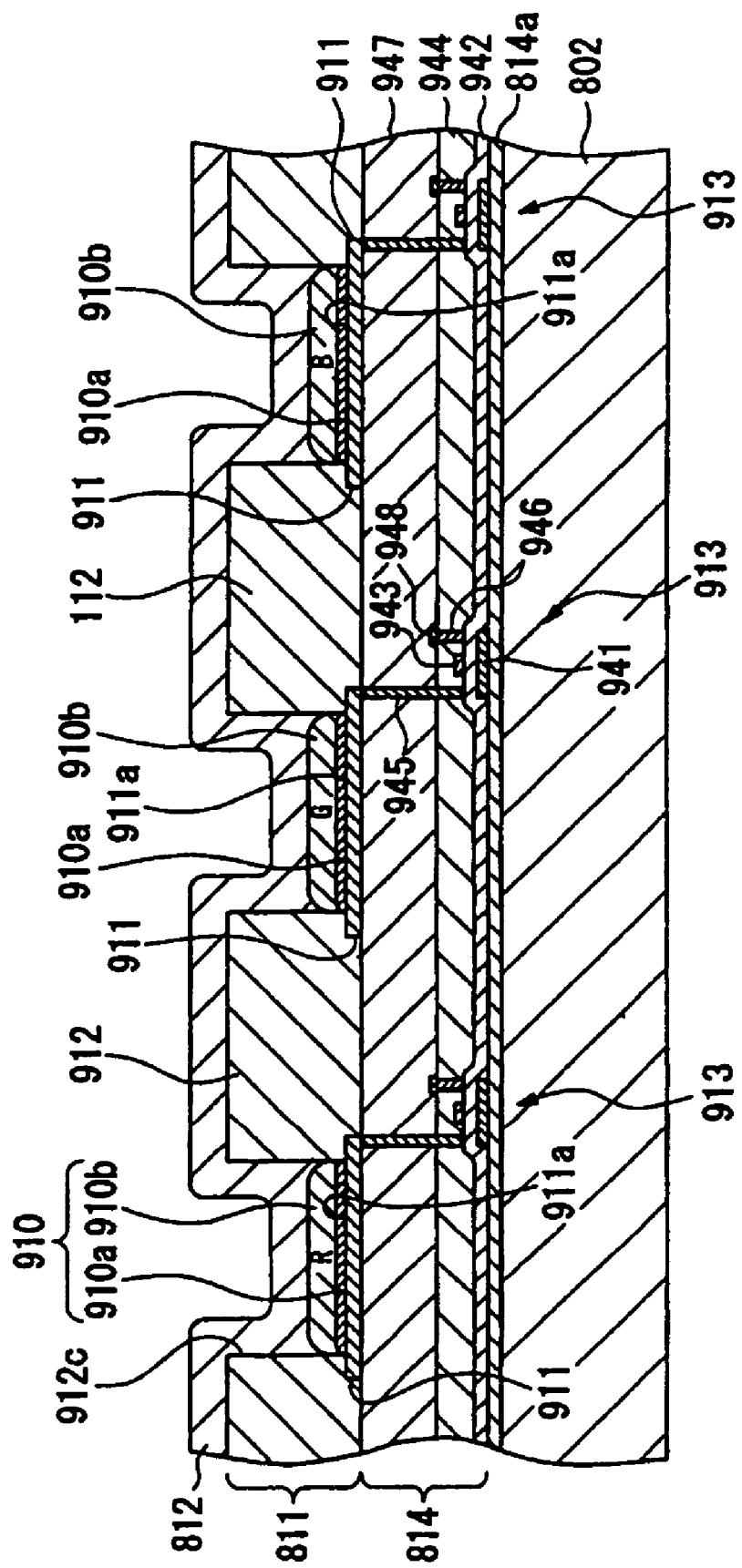
FIG. 31 is a cross-sectional view showing the essential portion of a display apparatus of the prior art.

In addition, although each R, G and B luminescent layer 110b in the first through sixth embodiments was explained with respect to the case of being arranged in a striped layout, the present invention is not limited to this, but rather various layout structures may be employed. For example, in addition to the striped layout as shown in FIG. 30A, a mosaic layout may be employed like that shown in FIG. 30B, or a delta layout may be employed like that shown in FIG. 30C.

In addition, although organic bank layer 312b made of black resin was used as a light blocking layer in the sixth embodiment, color mixing between colored light from adjacent luminescent layers may also be prevented by forming a light blocking layer on upper surface 312f of transparent organic bank layer 312b. Alternatively, similar effects are obtained by forming a light blocking layer at a location in opposition to the bank on the inside of sealing can 604' (surface in opposition to cathode 12').

What is claimed is:

1. A display apparatus comprising:
   a substrate;
   a plurality of luminescent elements formed on the substrate, each of the luminescent elements comprising a pixel electrode, a functional layer facing the pixel electrode, and a counter electrode; and
   bank sections and light blocking layers respectively allocated to the luminescent elements for separating the luminescent elements from each other,
   wherein each of the bank sections comprises a first bank layer located on the substrate side, and a second bank layer formed on the first bank layer,
   each of the light blocking layers is provided between the first and second bank layers,
   the first bank layer, the second bank layer, and the light blocking layer respectively define a first bank layer opening, a second bank layer opening, and a light blocking layer opening, in which the functional layer is formed,
   the first bank layer is superimposed on the pixel electrode, and
   the second bank layer opening and the light blocking layer opening are wider than the first bank layer opening.

2. A display apparatus according to claim 1 wherein, a light blocking opening is provided in the light blocking layer corresponding to the luminescent elements.

3. A display apparatus according to claim 1 wherein, the light blocking layers are formed from a first light blocking film located at a substrate side, and a second light blocking film located on a side away from the substrate.

4. A display apparatus according to claim 3 wherein, the first light blocking film is a metallic chromium film, and the second light blocking film is chromium oxide.

5. A display apparatus according to claim 1 wherein, the first bank layer is comprised of either $SiO_2$ or $TiO_2$.

6. A display apparatus according to claim wherein, the second bank layer is comprised of either acrylic resin or polyimide resin.

7. A display apparatus according to claim 1 wherein, at least a portion of the first bank layer is processed to have lyophilicity.

8. An electric device having a display apparatus and a drive circuit for driving the display apparatus wherein,
   the display apparatus comprises:
   a substrate;
   a plurality of luminescent elements formed on the substrate, each of the luminescent elements comprising a pixel electrode, a functional layer facing the pixel electrode, and a counter electrode; and
   bank sections and light blocking layers respectively allocated to the luminescent elements for separating the luminescent elements from each other,
   wherein each of the bank sections comprises a first bank layer located on the substrate side, and a second bank layer formed on the first bank layer,
   each of the light blocking layers is provided between the first and second bank layers,
   the first bank layer, the second bank layer, and the light blocking layer respectively define a first bank layer opening, a second bank layer opening, and a light blocking layer opening, in which the functional layer is formed,
   the first bank layer is superimposed on the pixel electrode, and
   the second bank layer opening and the light blocking layer opening are wider than the first bank layer opening.

* * * * *